United States Patent
Lin et al.

(10) Patent No.: US 12,432,942 B2
(45) Date of Patent: Sep. 30, 2025

(54) MIM CAPACITOR AND METHOD OF FORMING THE SAME

(71) Applicant: TAIWAN SEMICONDUCTOR MANUFACTURING COMPANY, LTD., Hsinchu (TW)

(72) Inventors: Hsing-Lien Lin, Hsinchu (TW); Hai-Dang Trinh, Hsinchu (TW); Yao-Wen Chang, Taipei (TW); Jui-Lin Chu, Hsinchu (TW); Cheng-Te Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 524 days.

(21) Appl. No.: 17/849,930

(22) Filed: Jun. 27, 2022

(65) Prior Publication Data

US 2023/0420493 A1   Dec. 28, 2023

(51) Int. Cl.
| | |
|---|---|
| *H10D 1/00* | (2025.01) |
| *H01L 21/768* | (2006.01) |
| *H01L 23/522* | (2006.01) |
| *H10D 1/68* | (2025.01) |

(52) U.S. Cl.
CPC ....... *H10D 1/042* (2025.01); *H01L 21/76816* (2013.01); *H01L 21/76832* (2013.01); *H01L 21/76877* (2013.01); *H01L 23/5223* (2013.01); *H10D 1/714* (2025.01)

(58) Field of Classification Search
CPC .. H10D 1/042; H10D 1/714; H01L 21/76816; H01L 21/76832; H01L 21/76877; H01L 23/5223
USPC ........................................................ 257/253
See application file for complete search history.

(56) References Cited

U.S. PATENT DOCUMENTS

| | | | |
|---|---|---|---|
| 9,209,190 B2 | 12/2015 | Chen et al. | |
| 10,276,651 B2 | 4/2019 | Lin et al. | |
| 11,063,157 B1 | 7/2021 | Cheng et al. | |
| 11,152,455 B2 | 10/2021 | Lin et al. | |
| 11,201,205 B2 | 12/2021 | Tsai et al. | |
| 2006/0158829 A1* | 7/2006 | Kwon | H01G 4/10 361/313 |
| 2017/0207299 A1* | 7/2017 | Lin | H01L 21/76895 |
| 2020/0066922 A1 | 2/2020 | Cheng et al. | |
| 2020/0279803 A1 | 9/2020 | Wei et al. | |
| 2022/0084935 A1* | 3/2022 | Lin | H01L 23/5223 |

\* cited by examiner

*Primary Examiner* — Tu-Tu V Ho
(74) *Attorney, Agent, or Firm* — NZ Carr Law Office

(57) ABSTRACT

A metal-insulator-metal (MIM) capacitor and methods of forming the same are described. In some embodiments, the method includes forming an opening having a first depth in one or more dielectric layers, depositing a layer in the opening and on the one or more dielectric layers, performing an anisotropic etch process to remove portions of the layer formed on horizontal surfaces, extending the opening to a second depth in the one or more dielectric layers, removing the layer, extending the opening to a third depth in the one or more dielectric layers, and forming a MIM capacitor in the opening.

20 Claims, 30 Drawing Sheets

US 12,432,942 B2

MIM CAPACITOR AND METHOD OF FORMING THE SAME

BACKGROUND

A capacitor is a standard component in many electronic circuits. A capacitor typically consists of first and second conductive electrodes separated by a dielectric insulating layer disposed between the first and second conductive electrodes. The conductive electrodes in a capacitor can be made of metals or semiconductors that are heavily doped with impurities, while the dielectric layer can be an oxide or other insulating materials (e.g., nitrides and ceramics).

In order to achieve effectively large capacitance values, a MIM capacitor can be fabricated in a deep trench in the front end of line (FEOL) in a semiconductor substrate where active devices are fabricated, which offers a large capacitance value compared to a standard planar capacitor. However, such deep trench MIM technology on the FEOL requires additional area on the semiconductor substrate and provides poor signal interference. Therefore, it is desirable to provide a method for forming a MIM capacitor with a large capacitance and a small chip area requirement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A to 6I illustrate various stages of manufacturing the MIM capacitor in an interconnect structure, in accordance with some embodiments.

DETAILED DESCRIPTION

Figure 1A:
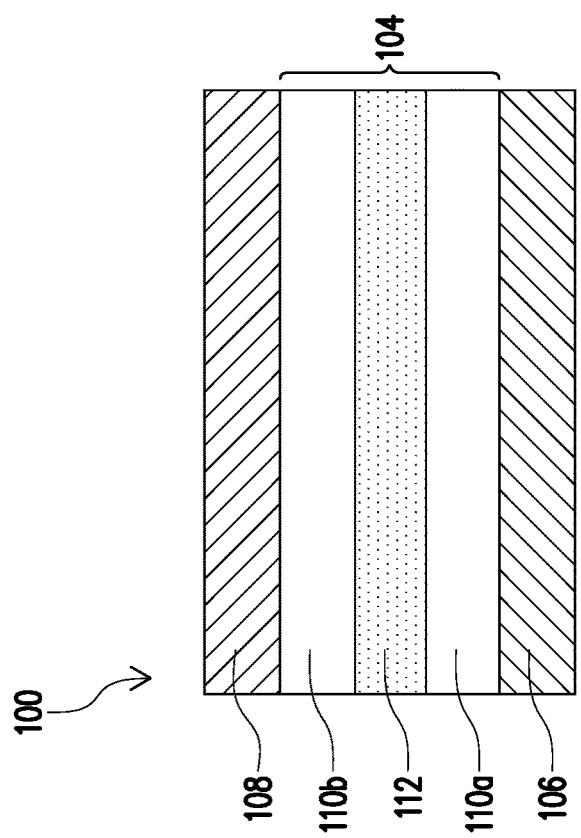
FIGS. 1A and 1B illustrate cross-sectional views of a metal-insulator-metal (MIM) capacitor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Figure 1B:
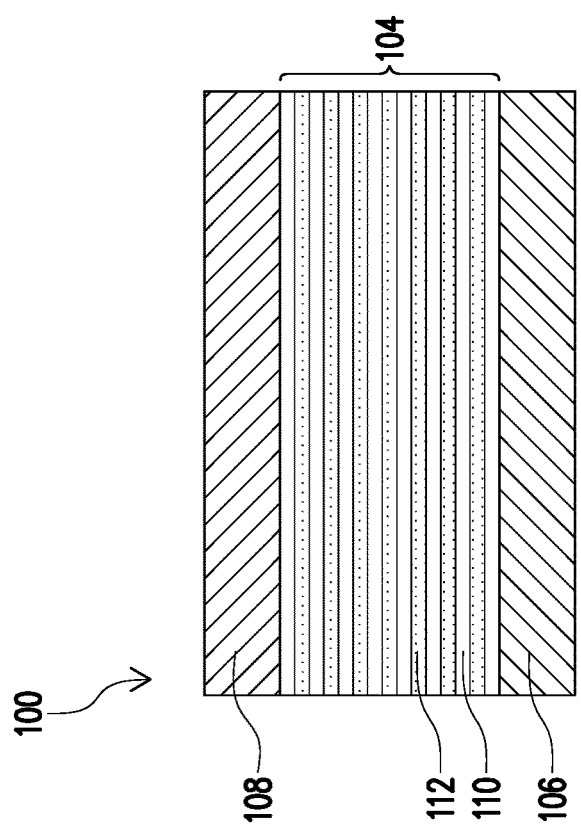

FIGS. 1A and 1B illustrate cross-sectional views of a metal-insulator-metal (MIM) capacitor 100, in accordance with some embodiments. As shown in FIG. 1A, the MIM capacitor 100 includes a capacitor insulator structure 104 disposed between a bottom electrode 106 and a top electrode 108. The bottom electrode 106 and the top electrode 108 are electrically conductive and may, for example, be or include titanium (Ti), titanium nitride (TiN), tantalum (Ta), tantalum nitride (TaN), some other electrically conductive material, or a combination of the foregoing. In some embodiments, the bottom electrode 106 and the top electrode 108 are or include a same material. For example, in some embodiments, both the top electrode 108 and the bottom electrode 106 are or include titanium nitride (TiN).

In some embodiments, the capacitor insulator structure 104 includes dielectric layers 110a, 110b and a dielectric layer 112 disposed between the dielectric layers 110a, 110b, as shown in FIG. 1A. For example, the dielectric 110a is disposed on the bottom electrode 106, the dielectric layer 112 is disposed on the dielectric layer 110a, and the dielectric layer 110b is disposed on the dielectric layer 112, and the top electrode 108 is disposed on the dielectric layer 110b. The dielectric layer 112 is configured to increase capacitance density and the time-dependent dielectric breakdown (TDDB) (e.g., device lifetime) of the MIM capacitor 102.

The dielectric layers 110a, 110b may, for example, be or include zirconium oxide ($ZrO_2$), aluminum oxide ($Al_2O_3$), hafnium oxide ($HfO_2$), silicon dioxide ($SiO_2$), hafnium tantalum oxide ($HfTaO_x$), some other dielectric material, or any combination of the foregoing. In some embodiments, the dielectric layers 110a, 110b are or include a metal oxide that is a high-k dielectric. A high-k dielectric may, for example, be a dielectric material having a dielectric constant greater than about 3.9 or some other suitable value. In some embodiments, the dielectric layers 110a, 110b are or include hafnium oxide. The dielectric layers 110a, 110b may include the same or different materials.

The dielectric layer 112 may, for example, be or include tantalum oxide ($Ta_2O_5$), tantalum aluminum oxide ($TaAlO_x$), hafnium tantalum oxide ($HfTaO_x$), or other suitable material. In some embodiments, the dielectric layer 112 is an amorphous layer, such as an amorphous tantalum oxide layer. The material of the dielectric layer 112 is different from the material(s) of the dielectric layers 110a, 110b. In some embodiments, the dielectric layers 110a, 110b are or include hafnium oxide, and the dielectric layer 112 is or includes tantalum oxide or tantalum aluminum oxide.

In some embodiments, the MIM capacitor 100 including the capacitor insulator structure 104 has improved performance (e.g., reduce leakage current), increased capacitance density, and increased device lifetime. For example, the dielectric layer 112 of the MIM capacitor 100 is made of a material that can reduce the likelihood that electrons travel through the capacitor insulator structure 104, i.e., leakage current. In some embodiments, the dielectric layer 112 is made of tantalum oxide or tantalum-based oxide. Tantalum oxide or tantalum-based oxide is an amorphous under the processing conditions for forming the MIM capacitor 100, and Tantalum oxide or tantalum-based oxide has a relatively high dielectric constant (e.g., greater than 20, such as about 25). The amorphous dielectric layer 112 may reduce leakage current. In some embodiments, the material of the dielectric layer 112 has a crystallization temperature substantially greater than about 400 degrees Celsius, such as over 700 degrees Celsius. For example, the dielectric layer 112 is made of tantalum oxide, which has a crystallization temperature of about 780 degrees Celsius. The processing temperature during the formation of the MIM capacitor 100 may be below 500 degrees Celsius, such as from about 400 degrees Celsius to about 500 degrees Celsius.

In some embodiments, the dielectric layers 110a, 110b each includes one or more crystals (e.g., the dielectric layers 110a, 110b are monocrystalline and/or polycrystalline), and the dielectric layers 110a, 110b are crystalline layers. For example, the dielectric layers 110a, 110b each include hafnium oxide, which has a crystallization temperature of about 400 degrees Celsius. Thus, the dielectric layers 110a, 110b are crystalline due to the processing temperature being greater than about 400 degrees Celsius. The one or more crystals in each dielectric layer 110a, 110b have a crystalline lattice. The crystalline lattices of the one or more crystals may be, for example, monoclinic, tetragonal, cubic, or the like. In some embodiments, because the dielectric layers 110a, 110b each includes the one or more crystals, the MIM capacitor 100 may have better (e.g., higher) capacitance density. However, the electrons may travel between crystal grain boundaries, leading to increased leakage current. By adding an amorphous dielectric layer 112 between the dielectric layers 110a, 110b, leakage current is reduced because there is no path for electrons to travel through an amorphous material, especially the amorphous material has a high dielectric constant, such as greater than about 20, for example about 25. As a result of the crystalline dielectric layers 110a, 110b and the amorphous dielectric layer 112, the MIM capacitor 100 may have a high capacitance density and good leakage performance (e.g., low leakage).

In some embodiments, the one or more crystals of the dielectric layer 110a or 110b have different crystalline lattices. For example, the one or more crystals of the dielectric layer 110a or 110b are less than or equal to about 20 percent by weight (wt %) monoclinic crystals, less than or equal to about 20 wt % cubic crystals, and between about 40 wt % and 80 wt % tetragonal crystals. In other embodiments, the crystalline lattices of the one or more crystals of the dielectric layer 110a or 110b may be the same (e.g., tetragonal). In some embodiments, because the amorphous dielectric layer 112 and the one or more crystals of the dielectric layer 110a or 100b being less than or equal to about 20 wt % monoclinic crystals, less than or equal to about 20 wt % cubic crystals, and between about 40 wt % and 80 wt % tetragonal crystals, the MIM capacitor 102 may have better (e.g., even higher) capacitance density and better (e.g., even higher) leakage performance (e.g., even lower leakage).

In some embodiments, the crystalline lattices of the one or more crystals of the dielectric layer 110a may be substantially the same as the crystalline lattices of the one or more crystals of the dielectric layer 110b. For example, the one or more crystals of the dielectric layer 110a may include substantially the same percentages of monoclinic crystals, cubic crystals, and tetragonal crystals as the dielectric layer 110b.

In some embodiments, the dielectric layer 110a has a first thickness, and the dielectric layer 110b has a second thickness. Each of the first and thicknesses may be between about 25 angstroms (Å) and about 35 Å. If the first or second thickness is less than about 25 Å, capacitance density of the MIM capacitor 100 may be too small. If the first or second thickness is greater than about 35 Å, leakage performance of the MIM capacitor 100 may be poor. In some embodiments, the first thickness is substantially the same as the second thickness.

In some embodiments, the dielectric layer 112 has a third thickness that is substantially less than the first or second thickness, such as less than about 15 Å. The third thickness is greater than about 5 Å. If the third thickness is less than about 5 Å, the leakage performance of the MIM capacitor 100 may be poor. If the third thickness is greater than 15 Å, manufacturing costs may be increased without any appreciable performance benefit. In some embodiments, the first thickness is about 30 Å, the second thickness is about 30 Å, and the third thickness is about 10 Å. In some embodiments, the total thickness of the capacitor insulator structure 104 ranges from about 70 Å to about 90 Å.

FIG. 1B is a cross-sectional view of the MIM capacitor 100 according to another embodiment. As shown in FIG. 1B, the capacitor insulator structure 104 includes alternating dielectric layers 110, 112. In some embodiments, the dielectric layer 110 includes the same material as the dielectric layer 110a or the dielectric layer 110b. In some embodiments, each of the dielectric layer 110, 112 may have a thickness of about 0.6 Å to about 1.2 Å and is formed by one or two cycles of an atomic layer deposition (ALD) process. The total thickness of the capacitor insulator structure 104 may range from about 70 Å to about 90 Å. The number of the dielectric layer 110 may range from about 2 to about 40, and the number of the dielectric layer 112 may range from about 1 to about 39. The benefits of having the alternating dielectric layers 110, 112 may be the same as the benefits of having the dielectric layers 110a, 110b, 112.

Figure 2:
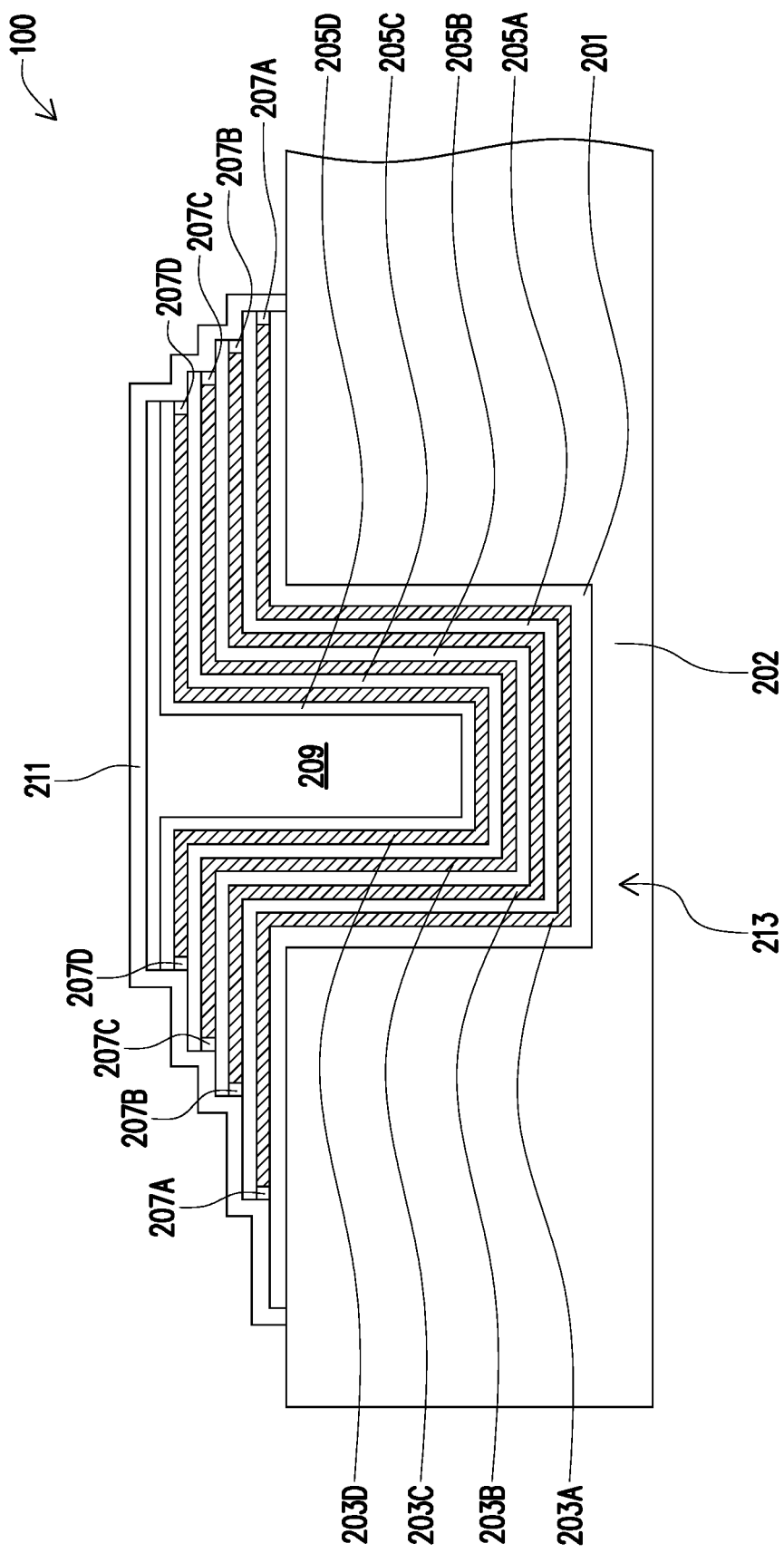
FIG. 2 illustrates a cross-sectional view of the MIM capacitor formed in a dielectric layer, in accordance with some embodiments.

FIG. 2 illustrates a cross-sectional view of the MIM capacitor 100 formed in a dielectric layer 202, in accordance with some embodiments. As shown in FIG. 2, the MIM capacitor 100 may be a deep trench capacitor (DTC) formed in a trench of a dielectric layer 202. The dielectric layer 202 may be one or more intermetal dielectric (IMD) layers, which are part of an interconnect structure. The dielectric layer 202 includes any suitable dielectric material, such as silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), amorphous fluorinated carbon, Parylene, BCB (bis-benzocyclobutenes), polyimide, and/or other future developed low-k dielectric materials. The MIM capacitor 100 includes conductive layers 203A-203D and capacitor insulator structures 205A-205D formed in the trench of the dielectric layer 202 in an alternating manner. The conductive layers 203A-203D may be also referred to as capacitor electrodes 203A-203D. In some embodiments, each of the conductive layers 203A-203D may be or include an electrically conductive material such as doped silicon, polysilicon, copper, tungsten, an aluminum or copper alloy, titanium, titanium nitride, tantalum, tantalum nitride, a combination thereof, or the like, and may be formed using atomic layer deposition (ALD). In some embodiments, the conductive layers 203A-203D includes the same material as the bottom electrode 106 or the top electrode 108. In some embodiments, each of the capacitor insulator structure 205A-205D include the same material as the capacitor insulator structure 104 and may be formed using ALD.

In some embodiments, spacers 207A-207D are formed on opposite ends of the corresponding conductive layers 203A-203D, respectively. Each of the spacers 207A-207D may include a dielectric material such as silicon oxide, silicon nitride, silicon oxynitride, a combination thereof, a multilayer thereof, or the like.

As shown in FIG. 2, a dielectric material 209 is formed on the MIM capacitor 100 and fills the trench formed in the dielectric layer 202. In some embodiments, the dielectric material 209 may include an oxide such as silicon oxide, a nitride such as a silicon nitride, a combination thereof, a multilayer thereof, or the like. In some embodiments, the dielectric material 209 is patterned to remove portions of the dielectric material 209 extending beyond the spacers 207D. In some embodiments, the patterning processes may comprise suitable photolithography and etching methods.

In some embodiments, after forming and patterning the dielectric material 209, an etch stop layer (ESL) 211 is formed over the MIM capacitor 100. In some embodiments, the ESL 211 may include one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, plasma-enhanced CVD (PECVD), ALD, a combination thereof, or the like.

As described in FIGS. 1A and 1B, the MIM capacitor 100 has increased capacitance density and decreased leakage current due to the capacitor insulator structure 104. The MIM capacitor 100 shown in FIG. 2 has even higher capacitance density because the DTC MIM capacitor 100 includes multiple capacitors. For example, the conductive layers 203A, 203B and the capacitor insulator structure 205A form a first MIM capacitor, the conductive layers 203B, 203C and the capacitor insulator structure 205B form a second MIM capacitor, and the conductive layers 203C, 203D and the capacitor insulator 205C form a third MIM capacitor. Thus, the DTC MIM capacitor 100 shown in FIG. 2 is equivalent to three MIM capacitors. Furthermore, the DTC MIM capacitor 100 is formed in a deep trench having a depth greater than about 10 microns, such as about 15 microns, which also increase the capacitance density. In some embodiments, the DTC MIM capacitor 100 shown in FIG. 2 has a capacitance density of over 2000 $\mu F/\mu m^2$. In addition, when amorphous tantalum oxide or amorphous tantalum-based oxide is used as the dielectric layer 112 in the capacitor insulator structure 104, the capacitance density is further increased. In some embodiments, the dielectric layers 110a, 110b includes hafnium oxide, the dielectric layer 112 includes aluminum oxide, and the DTC MIM capacitor 100 shown in FIG. 2 has a capacitance density of about 2400 $fF/\mu m^2$. In some embodiments, the dielectric layers 110a, 110b includes hafnium oxide, the dielectric layer 112 includes tantalum oxide, and the DTC MIM capacitor 100 shown in FIG. 2 has a capacitance density of about 3000 $fF/\mu m^2$ or higher.

Figure 3A:
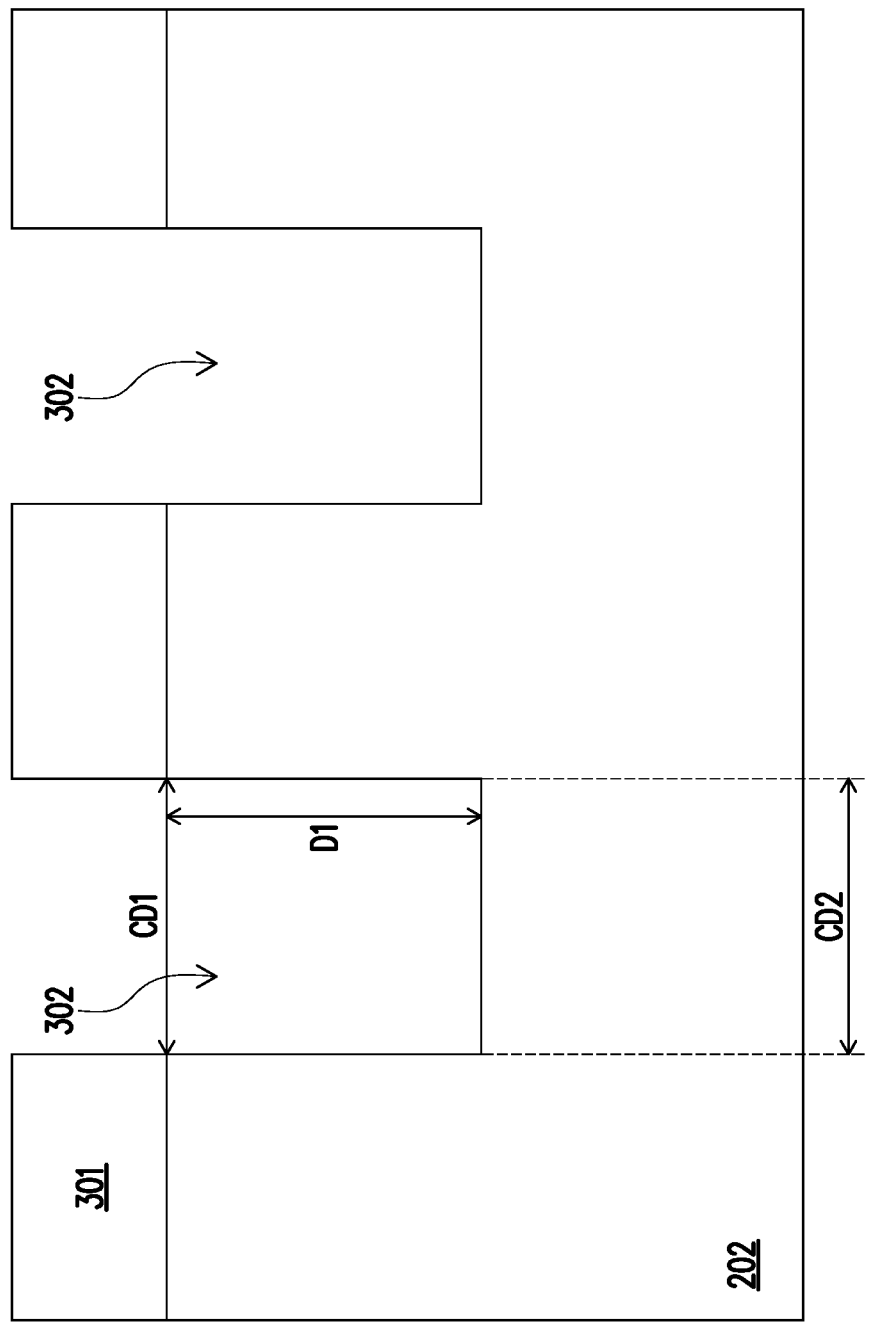
FIGS. 3A to 3Q illustrate various stages of manufacturing the MIM capacitor of FIG. 2, in accordance with some embodiments.
Figure 3B:
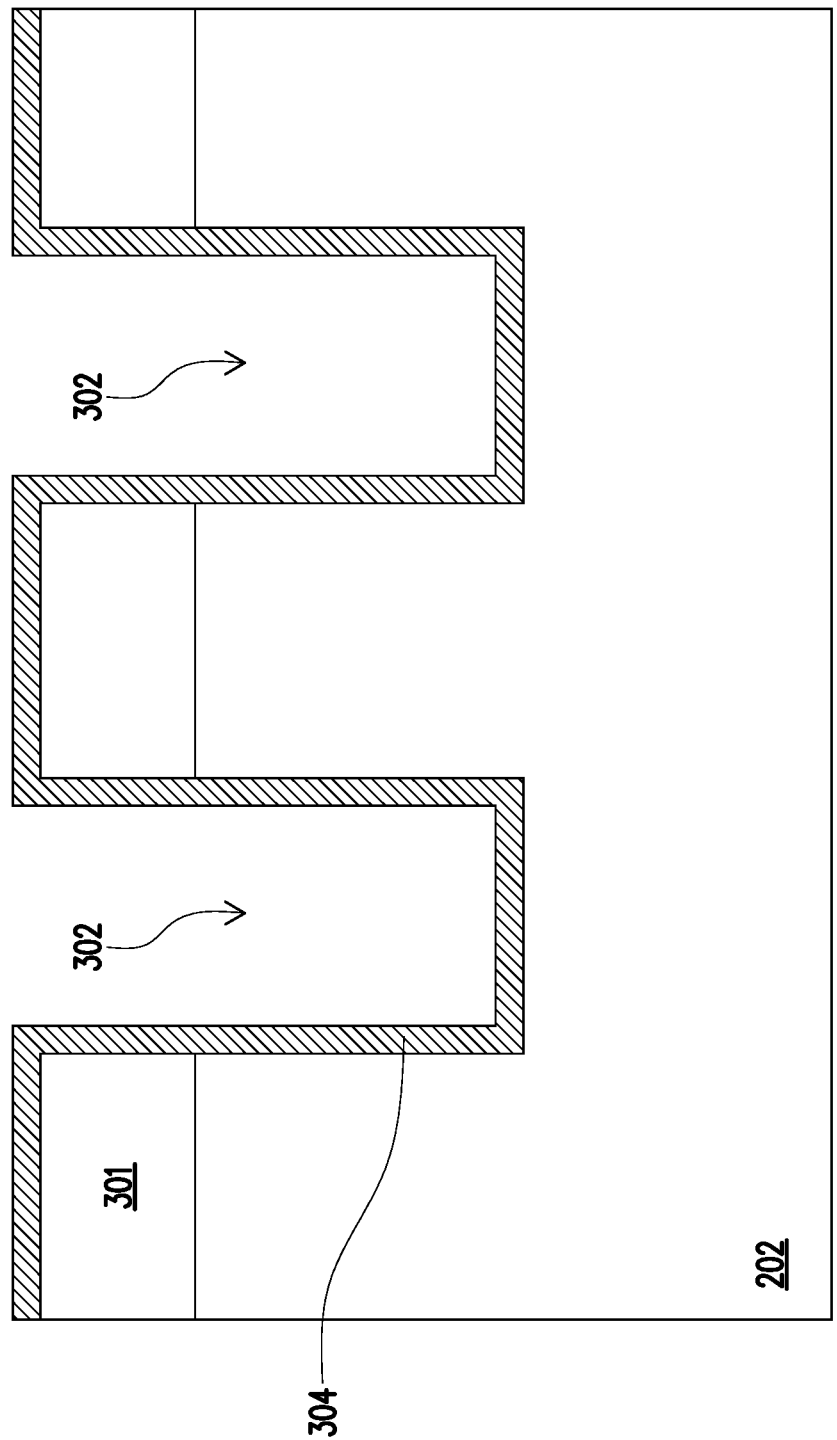
Figure 3C:
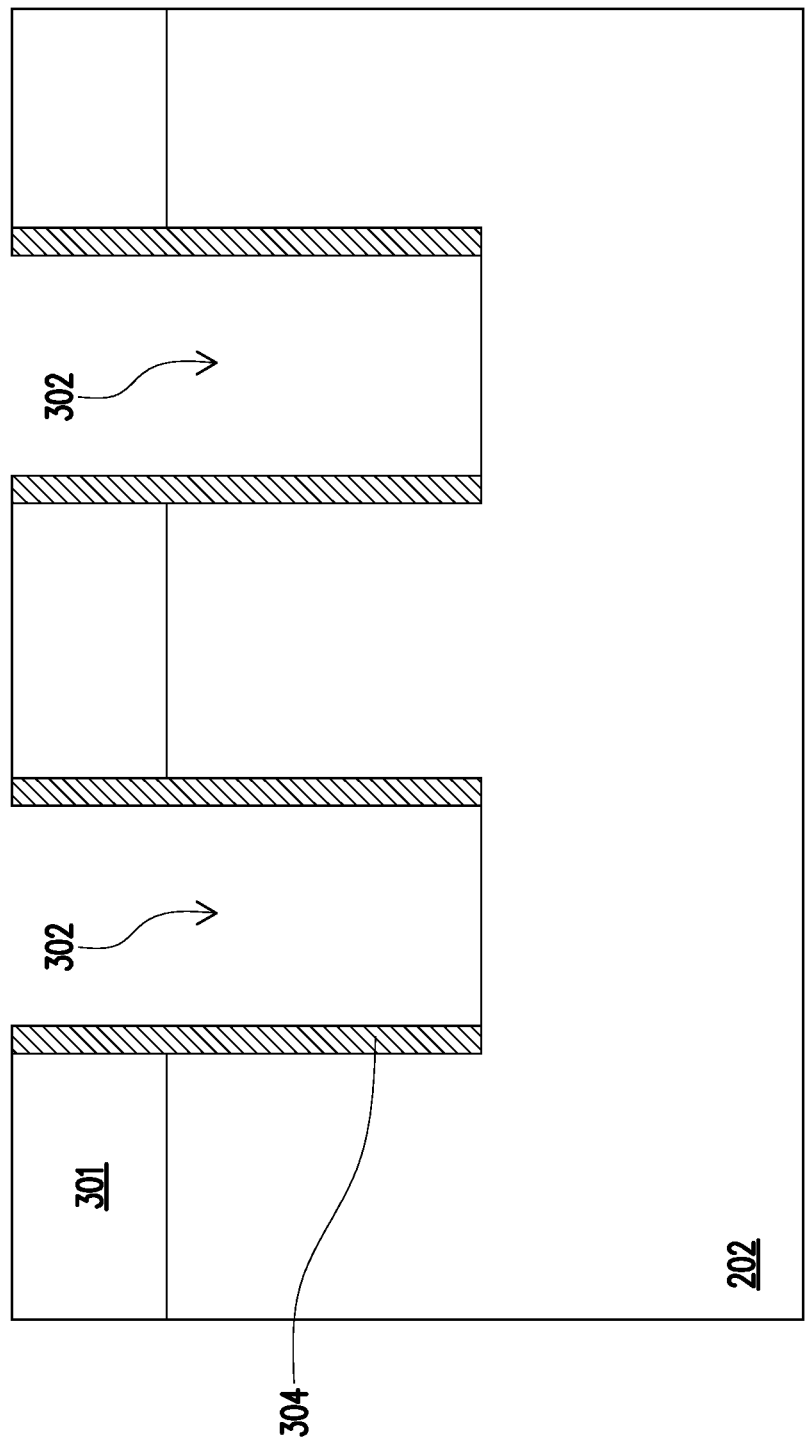
Figure 3D:
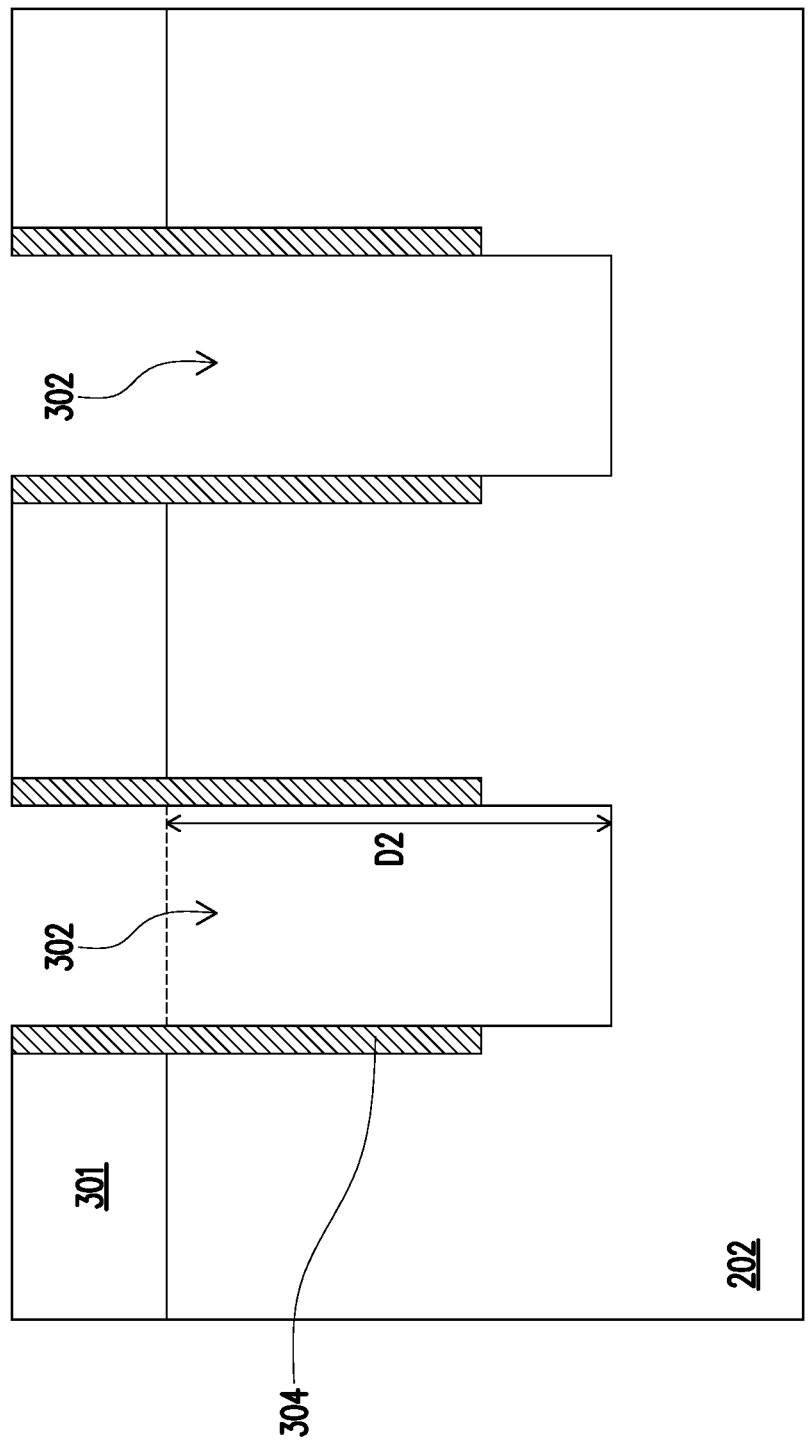
Figure 3E:
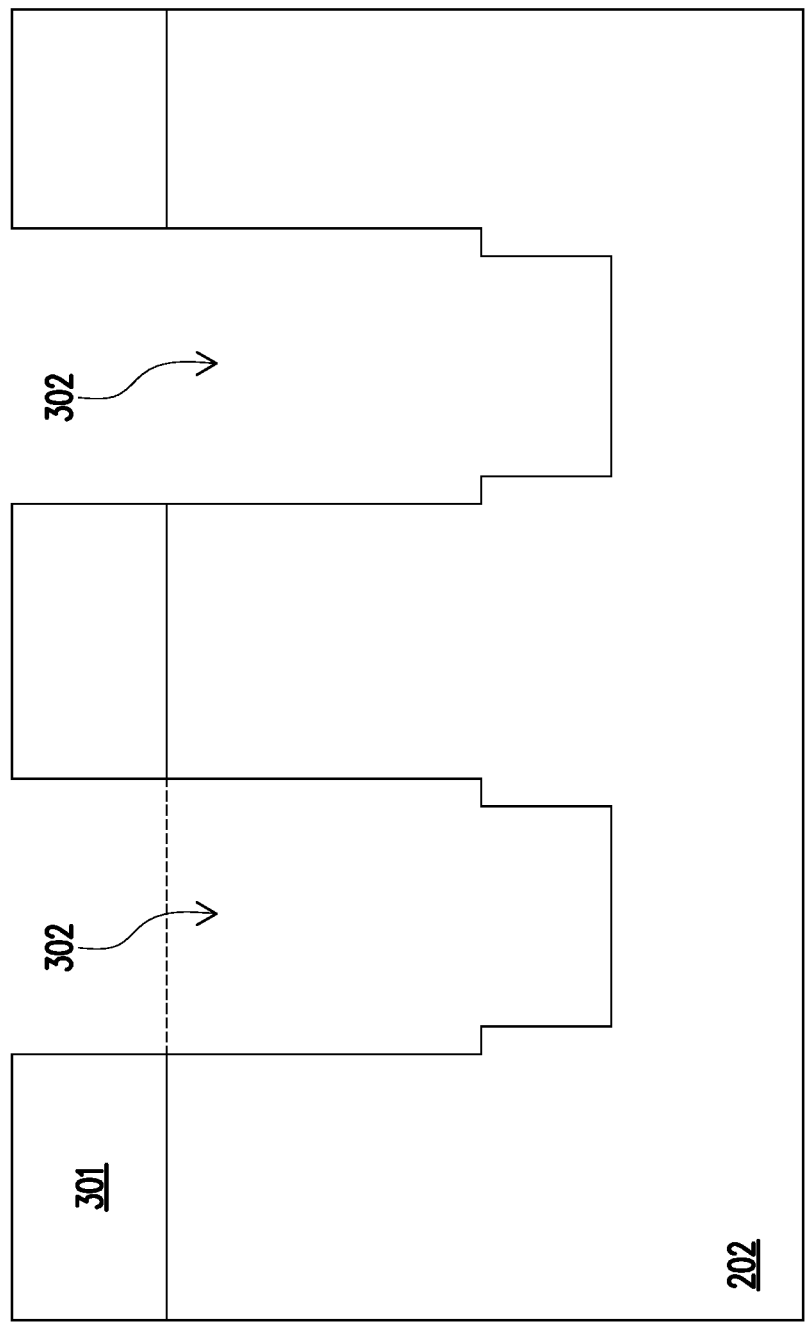
Figure 3F:
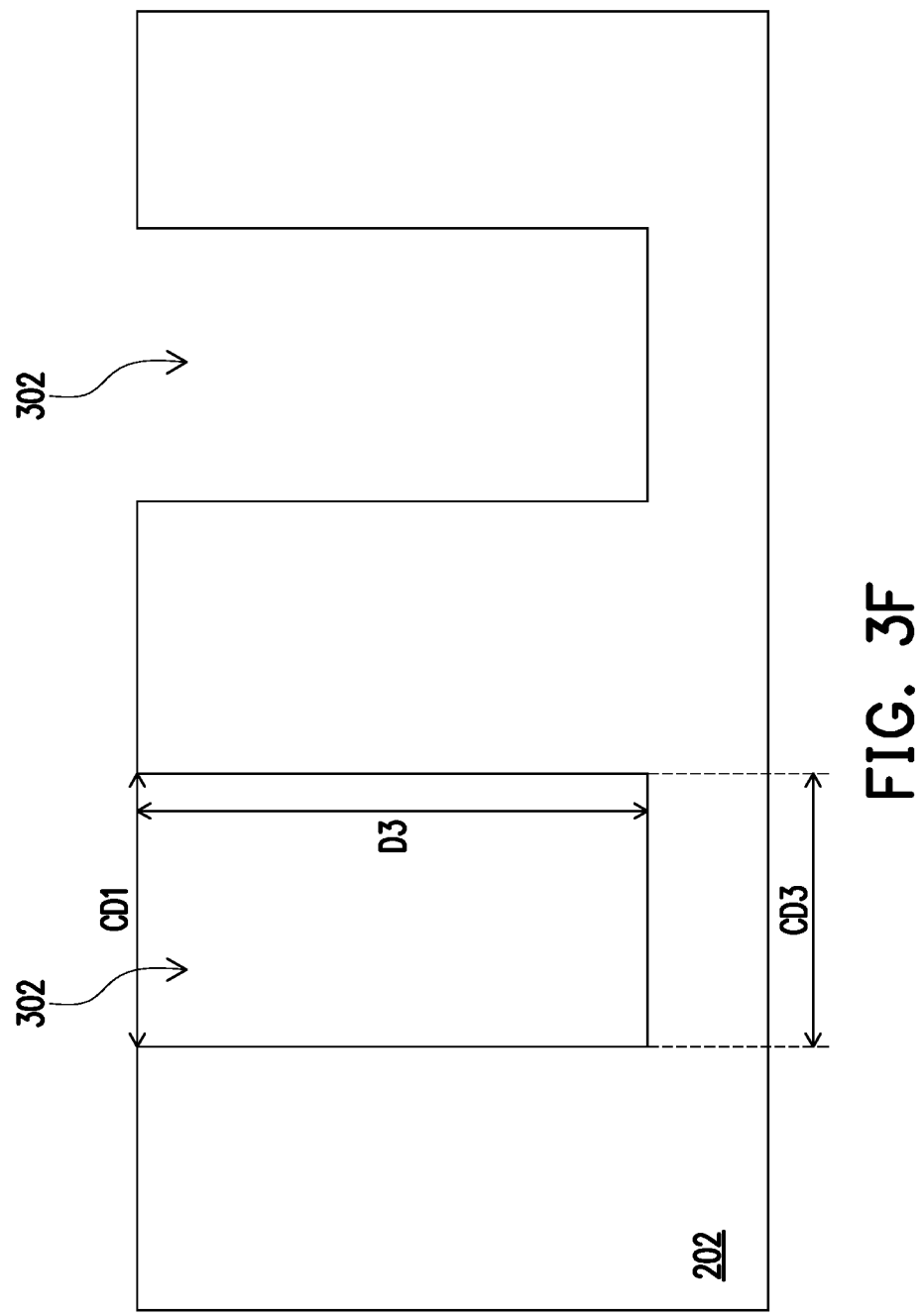
Figure 3G:
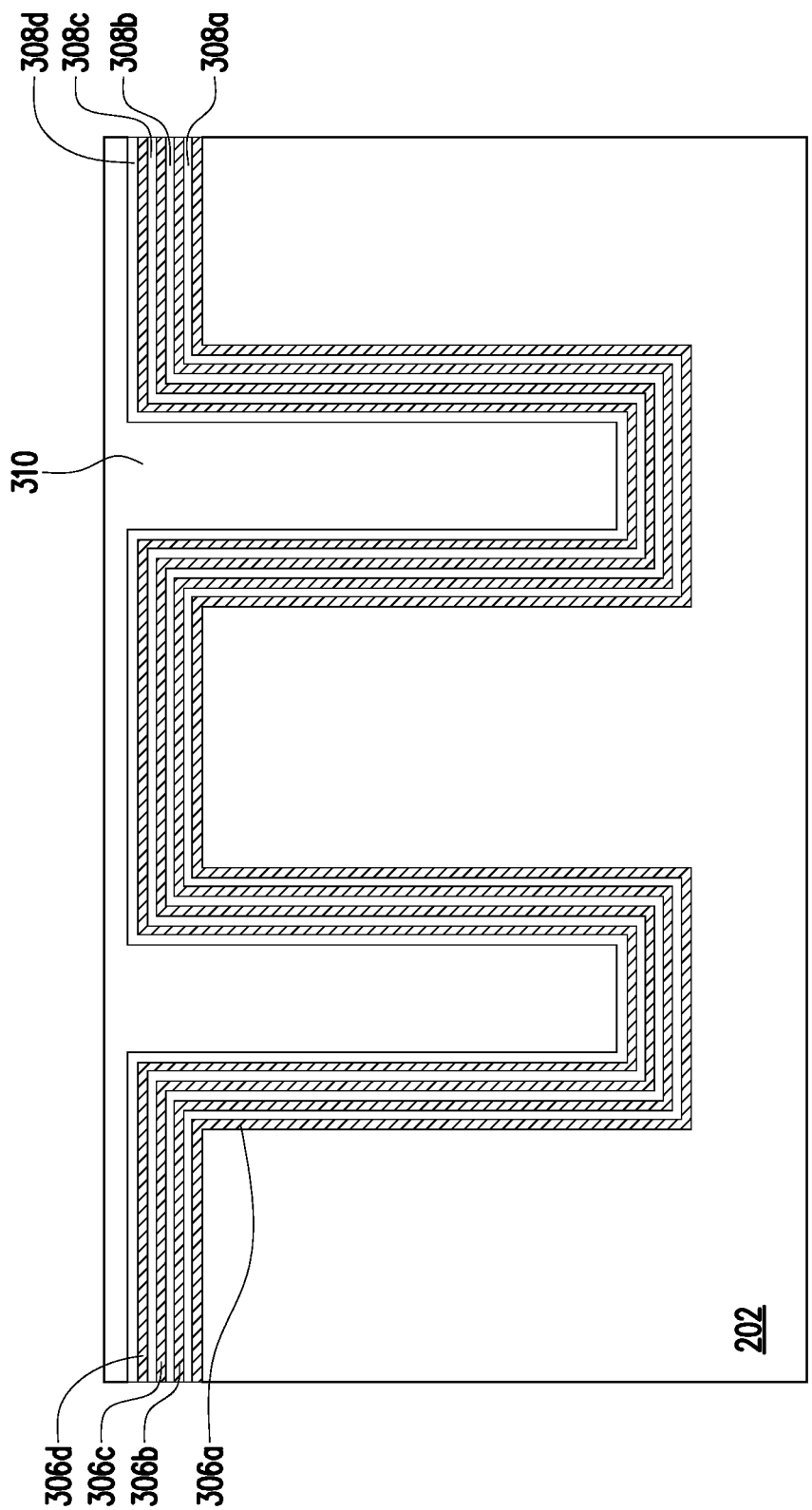
Figure 3H:
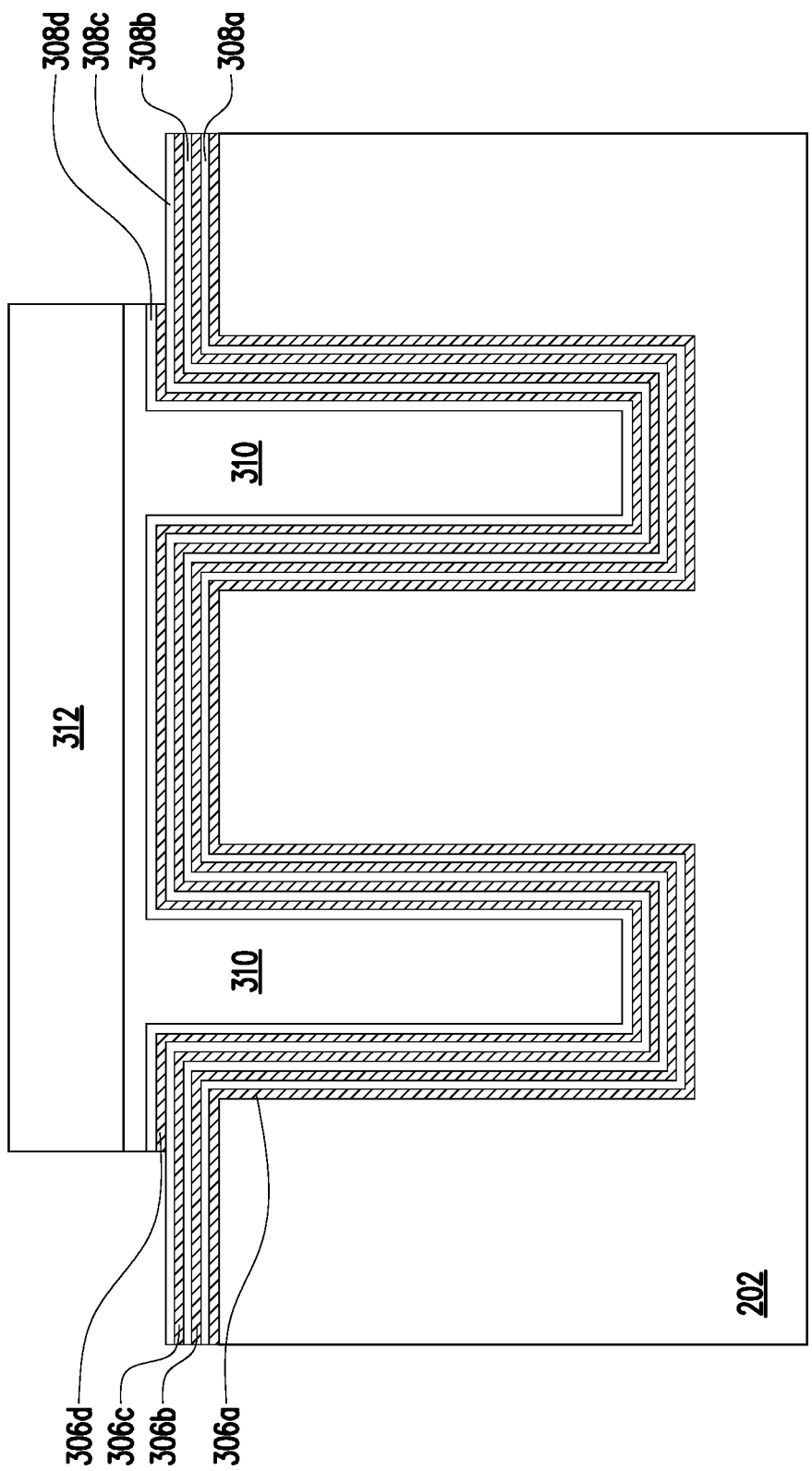
Figure 3I:
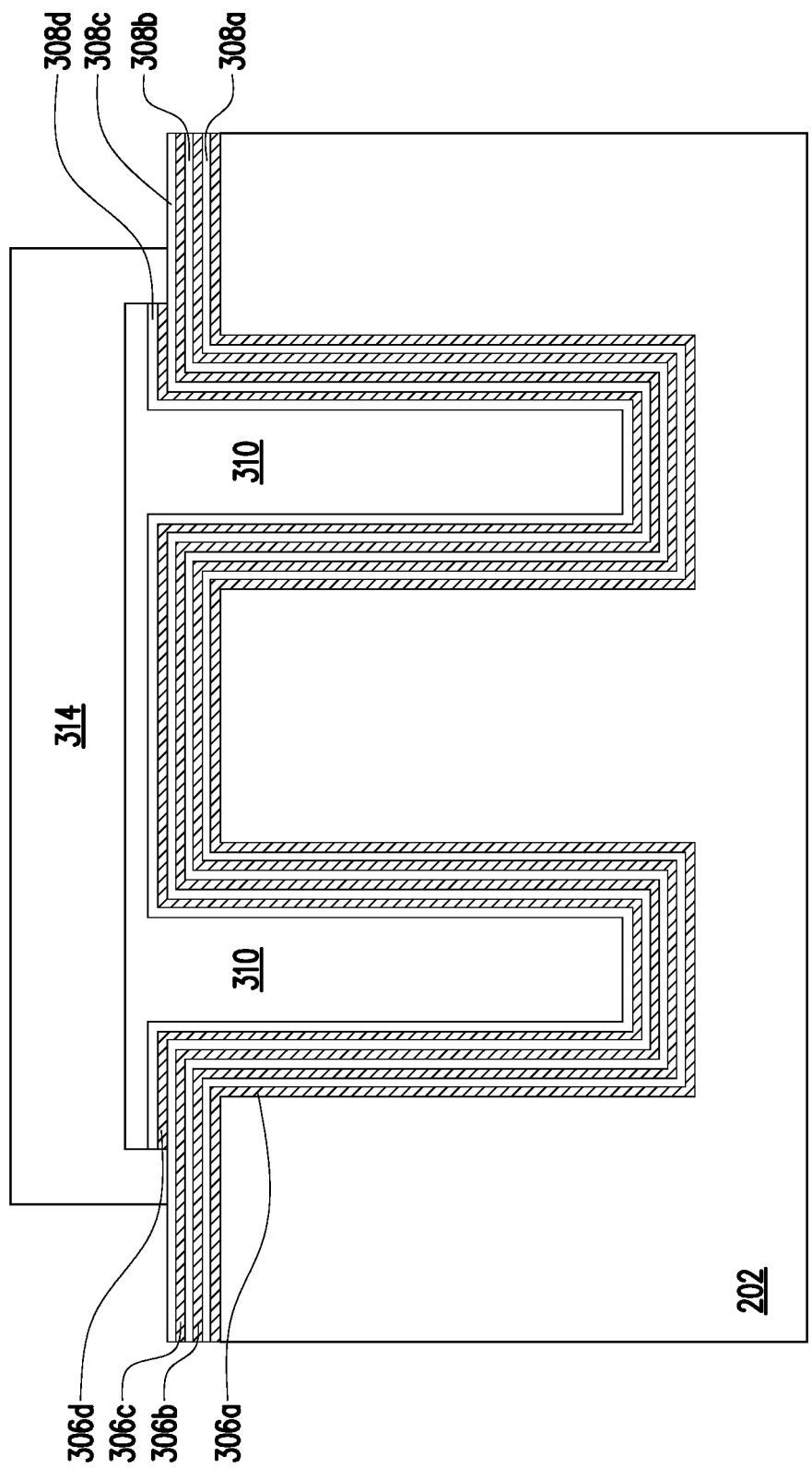
Figure 3J:
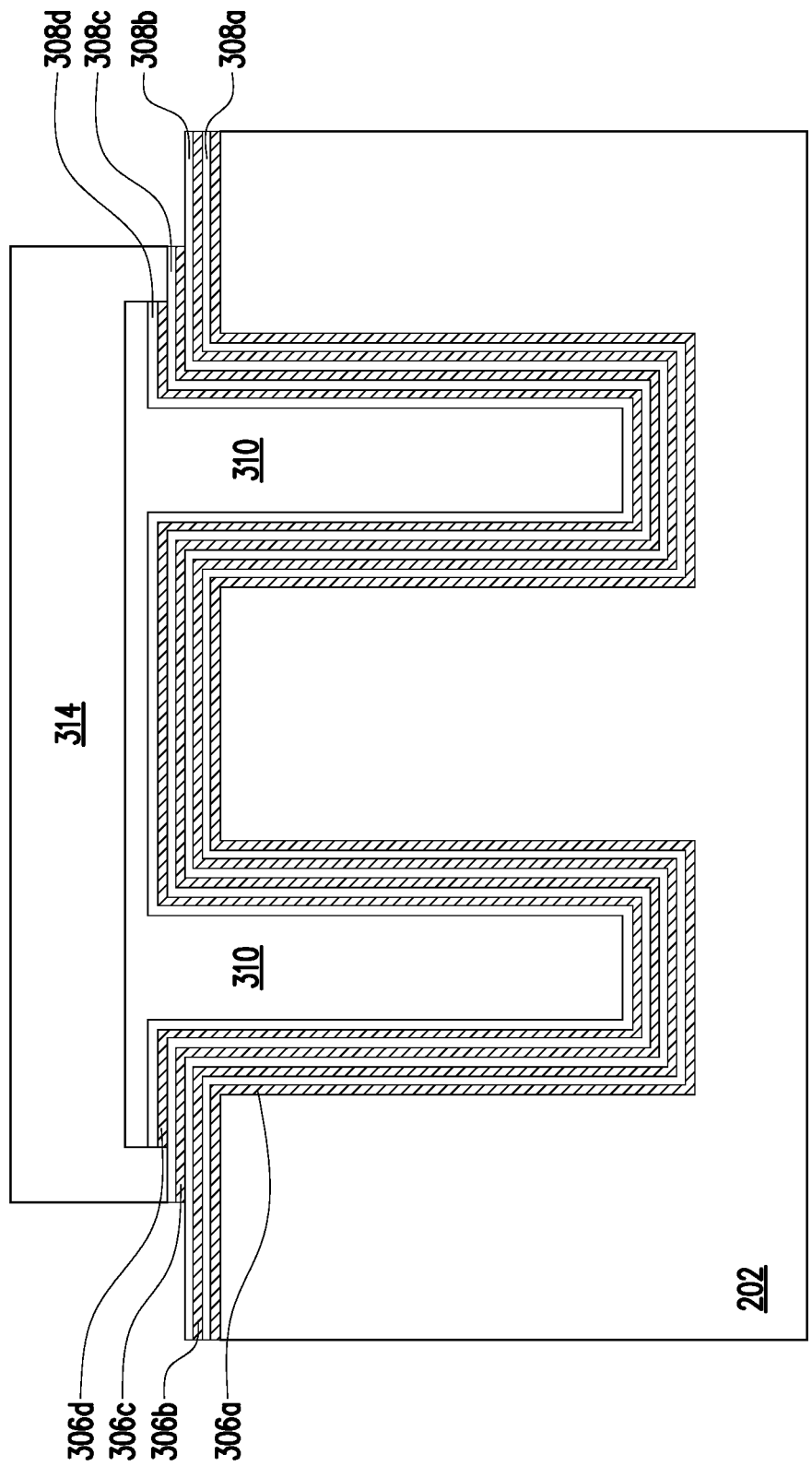
Figure 3K:
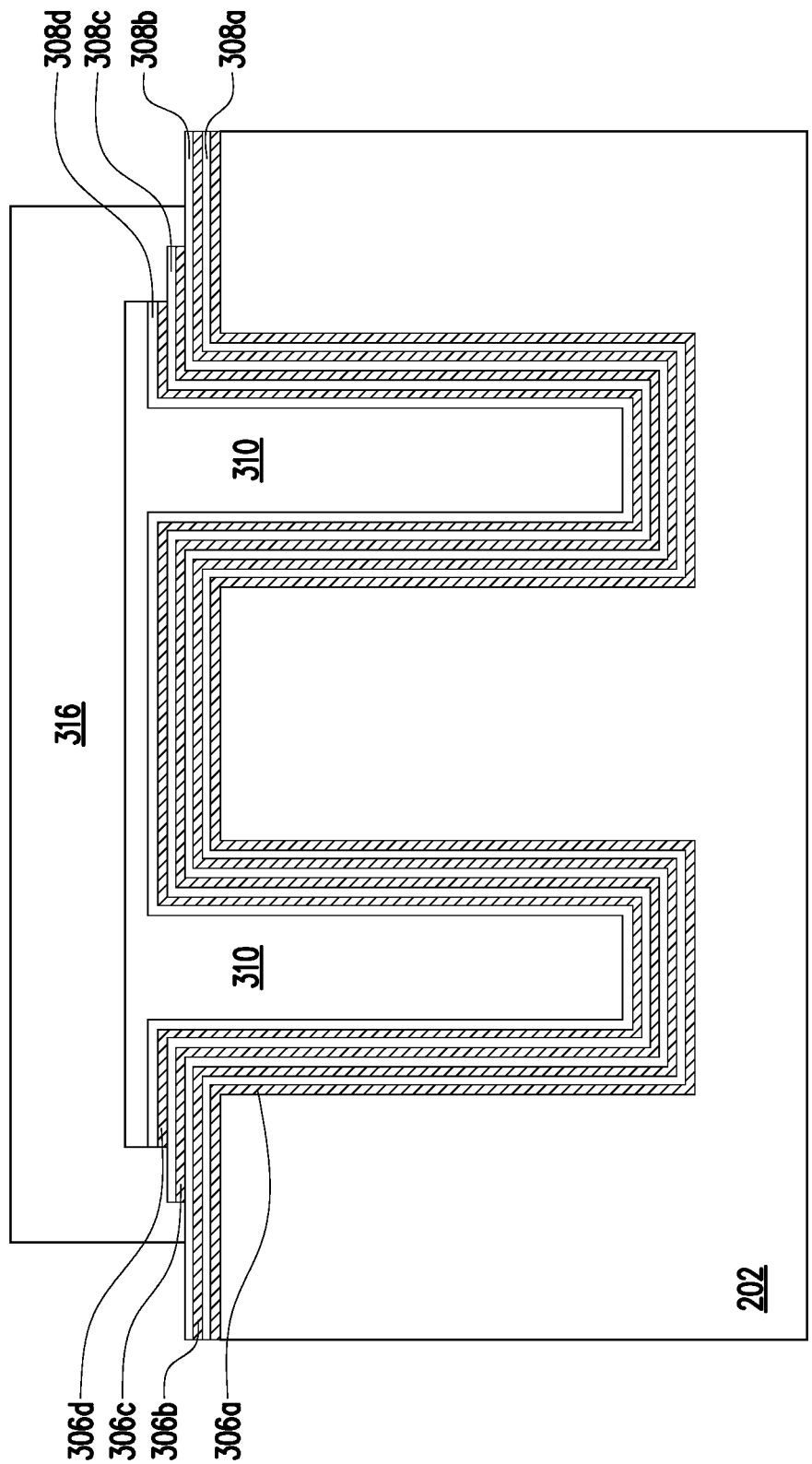
Figure 3L:
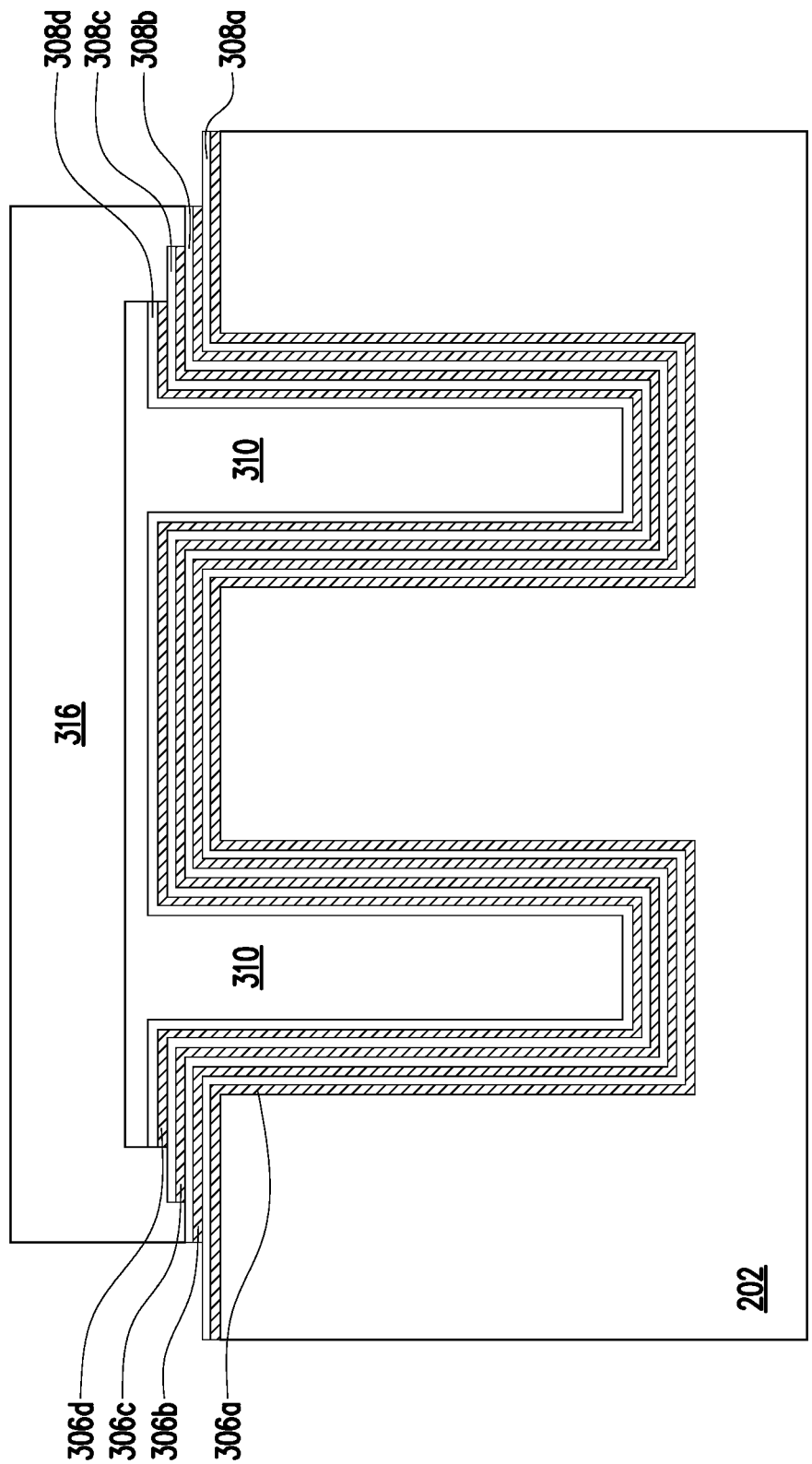
Figure 3M:
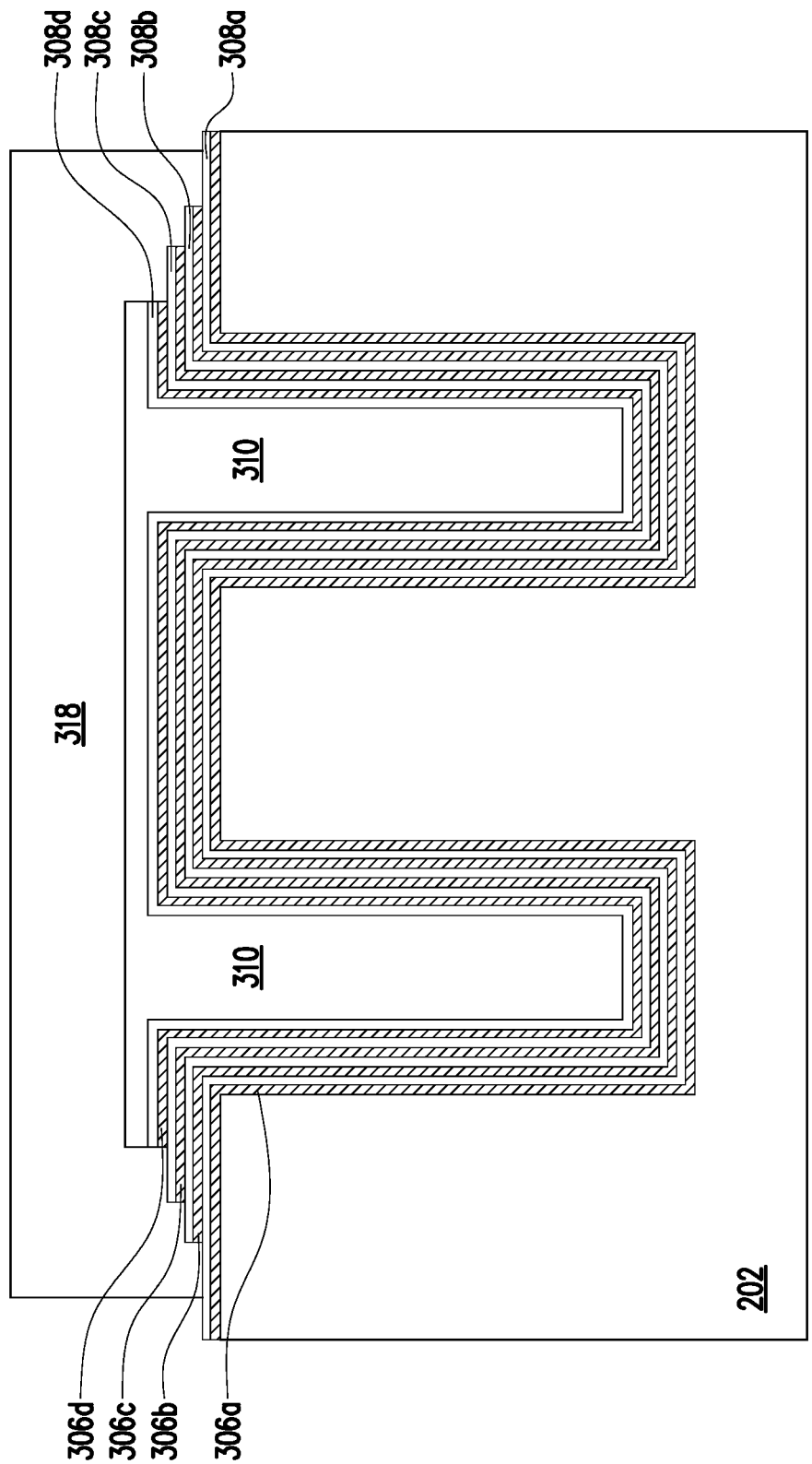
Figure 3N:
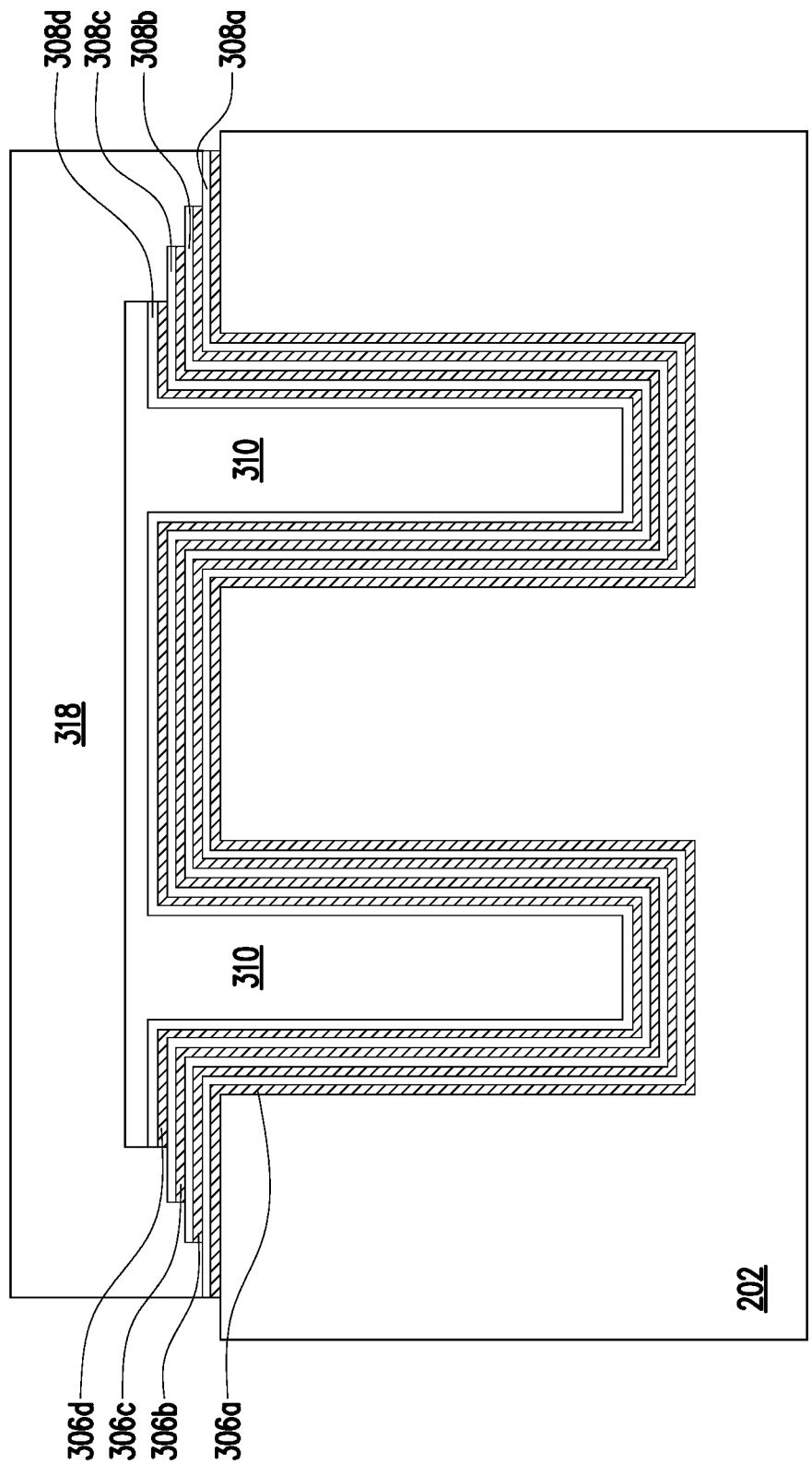
Figure 30:
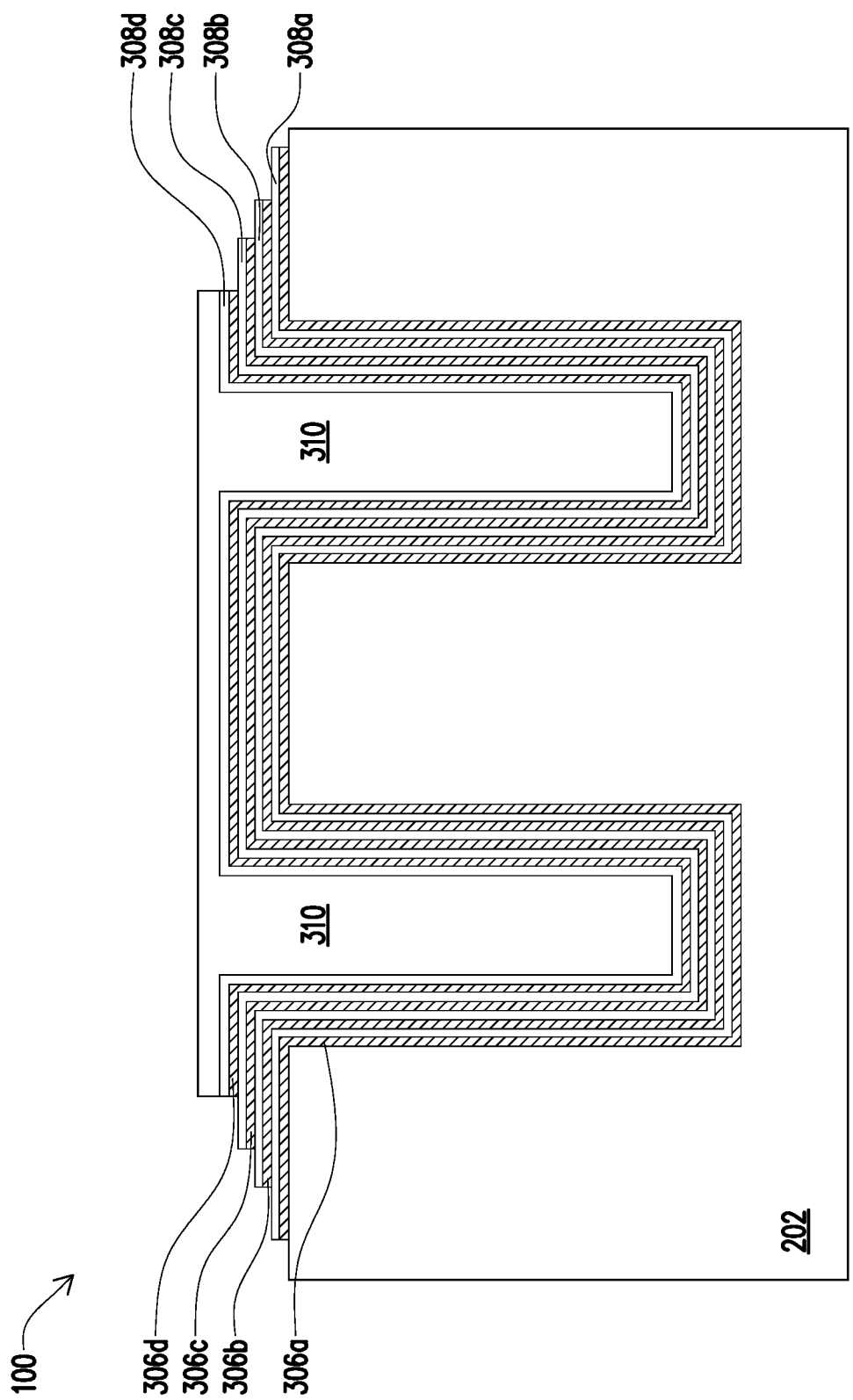
Figure 3P:
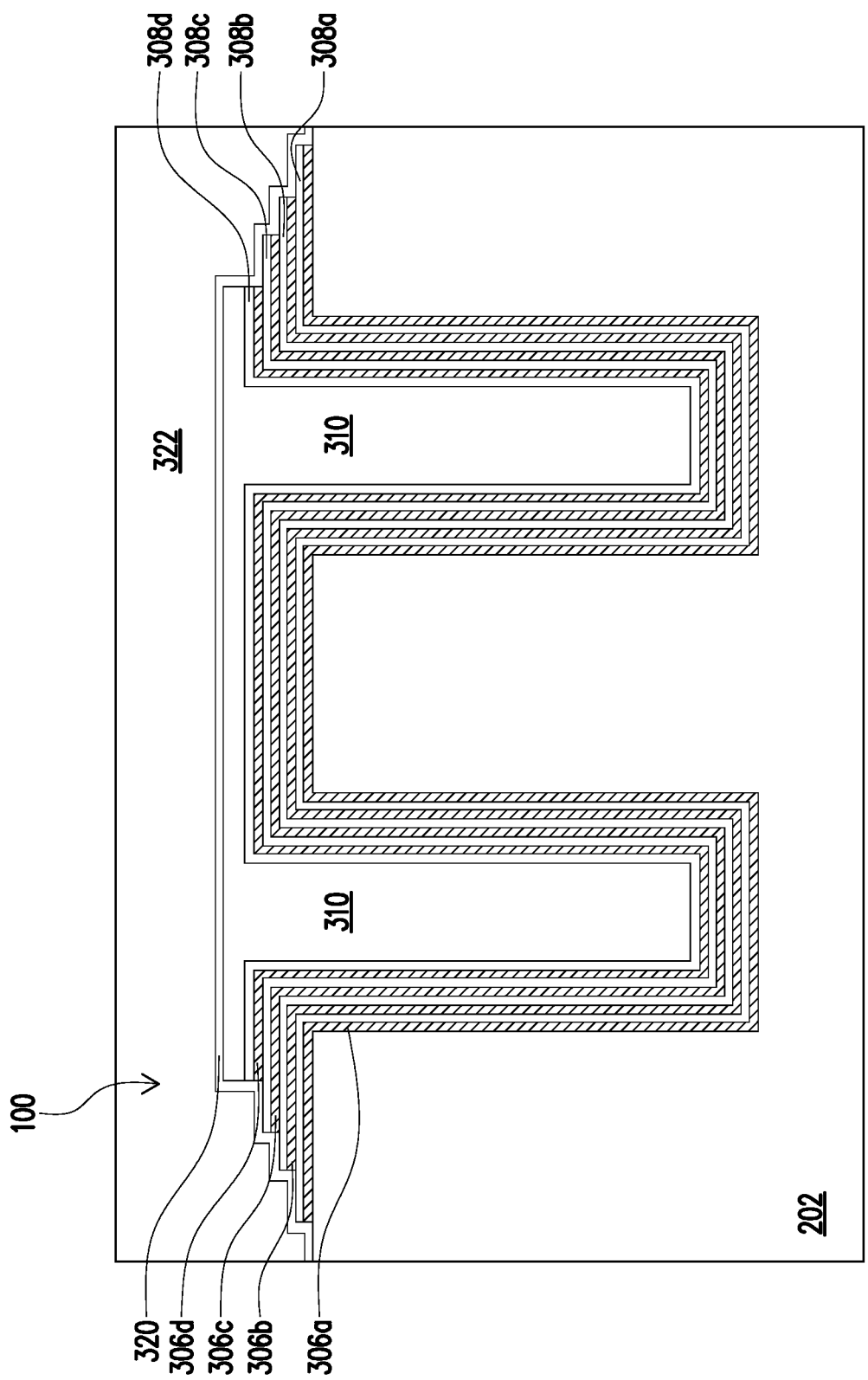
Figure 3Q:
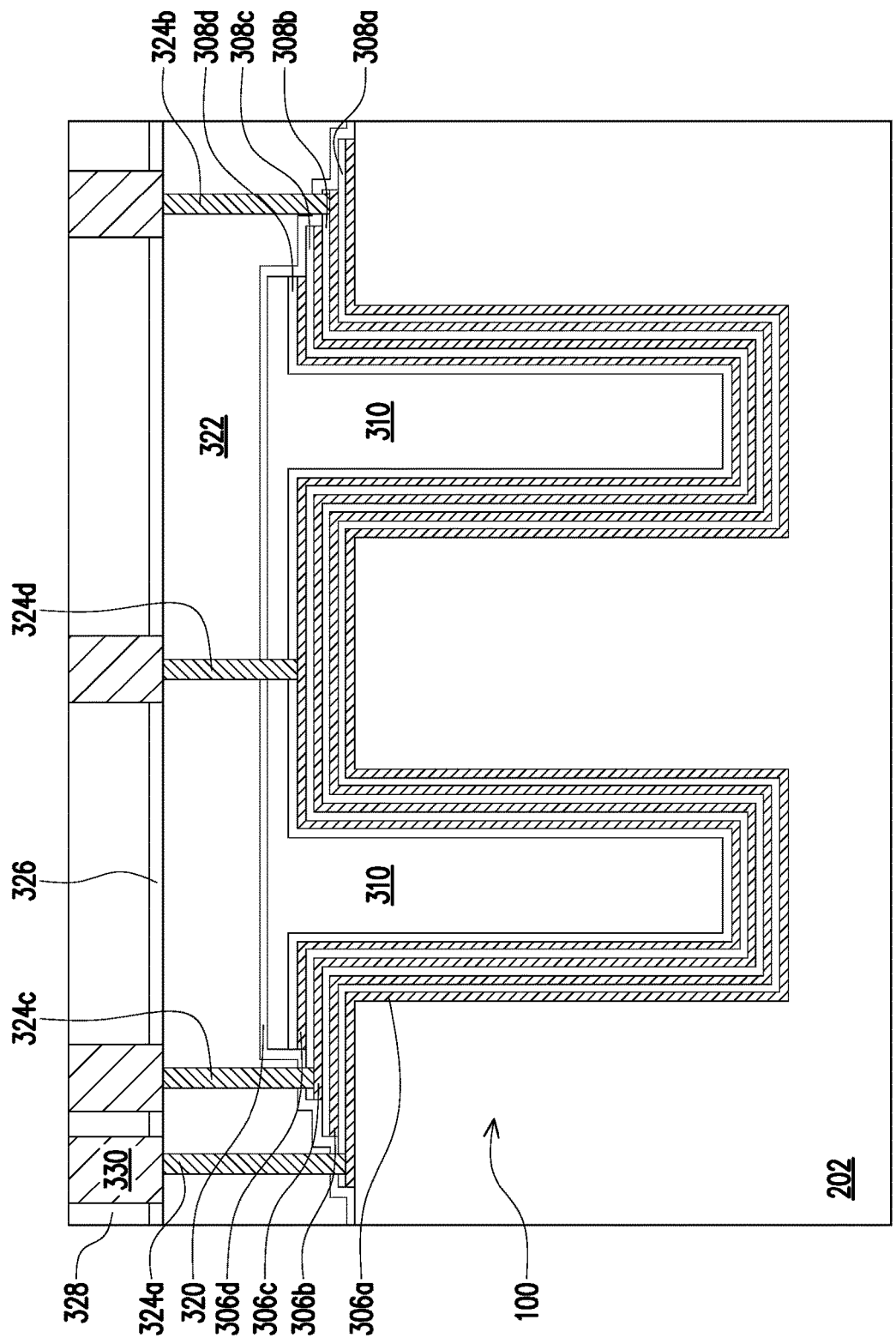

FIGS. 3A to 3Q illustrate various stages of manufacturing the MIM capacitor 100 of FIG. 2, in accordance with some embodiments. As shown in FIG. 3A, a patterned mask 301 is formed on the dielectric layer 202, and openings 302 are formed in the dielectric layer 202. In some embodiments, two or more openings 302 are formed in the dielectric layer 202. Each opening 302 has a top critical dimension CD1, a bottom critical dimension CD2, and a depth D1. In some embodiments, the top critical dimension CD1 ranges from about 300 nm to about 400 nm. In order for the bottom critical dimension CD2 to be substantially the same as the top critical dimension CD1, the depth D1 may be less than about 10 microns, such as from about 7 to 10 microns. If the depth D1 is greater than about 10 microns, the bottom critical dimension CD2 may be substantially smaller than the top critical dimension CD1. The shrinkage of the bottom critical dimension CD2 may lead to defective MIM capacitor 100 formed in the opening 302.

As shown in FIG. 3B, a layer 304 is formed on the patterned mask 301 and in the openings 302, such as on the sidewall of the dielectric layer 202 and the bottom of the opening 302. The layer 304 may be a conformal layer formed by a conformal process, such as ALD. The layer 304 may include a material having different etch selectivity than the material of the dielectric layer 202. In some embodiments, the layer 304 is a polymer. In some embodiments, the layer 304 is a semiconductor material, such as amorphous silicon. The layer 304 may have a thickness less than about 5 nm, such as from about 1 nm to about 5 nm. Next, an anisotropic etch process may be performed to remove portions of the layer 304 disposed on horizontal surfaces, as shown in FIG. 3C. For example, the portions of the layer 304 formed on the patterned mask 301 and on the bottom of the openings 302 are removed. As a result, the remaining portions of the layer 304 are disposed on sidewalls in the openings 302. The remaining portions of the layer 304 may be sidewall passivation layers.

As shown in FIG. 3D, an anisotropic etch process is performed to extend the openings 302 to a depth D2 substantially greater than the depth D1. In some embodiments, the depth D2 is about 10 microns to about 13 microns. The remaining portions of the layer 304 protect the sidewalls of the opening 302 from the anisotropic etch process.

As shown in FIG. 3E, the remaining portions of the layer 304 are removed by any suitable process. In some embodiments, the remaining portions of the layer 304 are removed by a selective etch process that does not substantially affect the dielectric layer 202. Next, another anisotropic etch process is performed to further extend the opening 302 to a depth D3, as shown in FIG. 3F. The anisotropic etch process removes the step formed on the sidewall of the dielectric layer 202 in the opening 302 as a result of the removal of the remaining portions of the layer 304, while the top critical dimension CD1 is not substantially affected. The resulting openings 302 may each have the top critical dimension CD1 and the bottom critical dimension CD3 substantially the same as the top critical dimension CD1, as a result of the anisotropic etch process. The depth D3 may range from about 15 microns to about 17 microns. In some embodiments, the opening 302 has an aspect ratio ranging from about 42 to about 50.

As shown in FIG. 3G, a plurality of conductive layers 306a-306d and a plurality of capacitor insulator structures 308a-308d are formed in the openings 302 in alternating manner. The conductive layers 306a-306d may include the same material as the conductive layers 203A-203D (FIG. 2), and the capacitor insulator structures 308a-308d may include the same materials as the capacitor insulator structures 205A-205D (FIG. 2). In some embodiments, the conductive layers 306a-306d and the layers of the capacitor insulator structures 308a-308d are conformal layers formed by ALD processes. A dielectric material 310 is formed on the topmost capacitor insulator structure 308d and fills the openings 302. The dielectric material 310 may include the same material as the dielectric material 209 (FIG. 2).

As shown in FIG. 3H, a patterned mask 312 is formed on the dielectric material 310, and the exposed portions of the dielectric material 310 and the portions of the capacitor insulator structure 308d and conductive layer 306d disposed thereunder are removed by one or more etch processes. An optional oxidation or nitridation process may be performed to form the spacers, such as the spacers 207D (FIG. 2), on opposite ends of the conductive layer 306d.

As shown in FIG. 3I, the patterned mask 312 is removed, and another patterned mask 314 is formed on the dielectric material 310 and portions of the capacitor insulator structure 308c. The exposed portions of the capacitor insulator structure 308c and the portions of the conductive layer 306c disposed thereunder are removed by one or more etch processes, as shown in FIG. 3J. An optional oxidation or nitridation process may be performed to form the spacers, such as the spacers 207C (FIG. 2), on opposite ends of the conductive layer 306c.

As shown in FIG. 3K, the patterned mask 314 is removed, and another patterned mask 316 is formed on the dielectric material 310 and portions of the capacitor insulator structure 308b. The exposed portions of the capacitor insulator structure 308b and the portions of the conductive layer 306b disposed thereunder are removed by one or more etch processes, as shown in FIG. 3L. An optional oxidation or nitridation process may be performed to form the spacers, such as the spacers 207B (FIG. 2), on opposite ends of the conductive layer 306b.

As shown in FIG. 3M, the patterned mask 316 is removed, and another patterned mask 318 is formed on the dielectric material 310 and portions of the capacitor insulator structure 308a. The exposed portions of the capacitor insulator structure 308a and the portions of the conductive layer 306a disposed thereunder are removed by one or more etch processes, as shown in FIG. 3N. An optional oxidation or nitridation process may be performed to form the spacers, such as the spacers 207A (FIG. 2), on opposite ends of the conductive layer 306a.

As shown in FIG. 3O, the patterned mask 318 is removed. The resulting structure may be the MIM capacitor 100, such as DTC MIM capacitor 100 shown in FIG. 2. The MIM capacitor 100 may be formed in one trench in the dielectric material 202 (FIG. 2), in two trenches in the dielectric material 202 (FIG. 3N), or in multiple trenches in the dielectric material 202. The processes described in FIGS. 3G to 3O may be one of various methods for forming the MIM capacitor 100 in the openings 302. In some embodiments, a pair of the conductive layer 306 and the capacitor insulator structure 308 may be formed and patterned prior to forming the other layers thereon. For example, the conductive layer 306a and the capacitor insulator structure 308a may be formed and patterned, the conductive layer 306b and the capacitor insulator structure 308b may be formed on the patterned capacitor insulator structure 308a and then patterned, the conductive layer 306c and the capacitor insulator structure 308c may be formed on the patterned capacitor insulator structure 308b and then patterned, and the conductive layer 306d and the capacitor insulator structure 308d may be formed on the patterned capacitor insulator structure 308c and then patterned. Any suitable processes may be performed to form the MIM capacitor 100 in the openings 302.

As shown in FIG. 3P, an etch stop layer 320 is formed on the MIM capacitor 100 and the dielectric material 310, and a dielectric material 322 is formed on the etch stop layer 320. The etch stop layer 320 may include the same material as the etch stop layer 211, and the dielectric material 322 may include the same material as the dielectric material 202.

As shown in FIG. 3Q, a plurality of conductive features 324a-324d are formed in the dielectric material 322 and the etch stop layer 320 to be in electrical contact with the conductive layers 306a-306d, respectively. For example, the conductive feature 324a is formed in the dielectric material 322, the etch stop layer 320, and the capacitor insulator structure 308a and is in contact with the conductive layer 306a. The conductive feature 324b is formed in the dielectric material 322, the etch stop layer 320, and the capacitor insulator structure 308b and is in contact with the conductive layer 306b. The conductive feature 324c is formed in the dielectric material 322, the etch stop layer 320, and the capacitor insulator structure 308c and is in contact with the conductive layer 306c. The conductive feature 324d is formed in the dielectric material 322, the etch stop layer 320, and the capacitor insulator structure 308d and is in contact with the conductive layer 306d. An etch stop layer 326 is formed on the dielectric material 322 and the conductive features 324a-324d. The etch stop layer 326 may include the same material as the etch stop layer 320. A dielectric layer 328 is formed on the etch stop layer 326. The dielectric layer 328 may include the same material as the dielectric material 322. Conductive features 330 are formed in the dielectric layer 328 and the etch stop layer 326 and are in contact with corresponding conductive features 324a-324d. The dielectric material 202, the dielectric material 322, and the dielectric layer 328 may be IMD layers in an interconnect structure formed over a substrate having a plurality of devices formed there.

Figure 4:
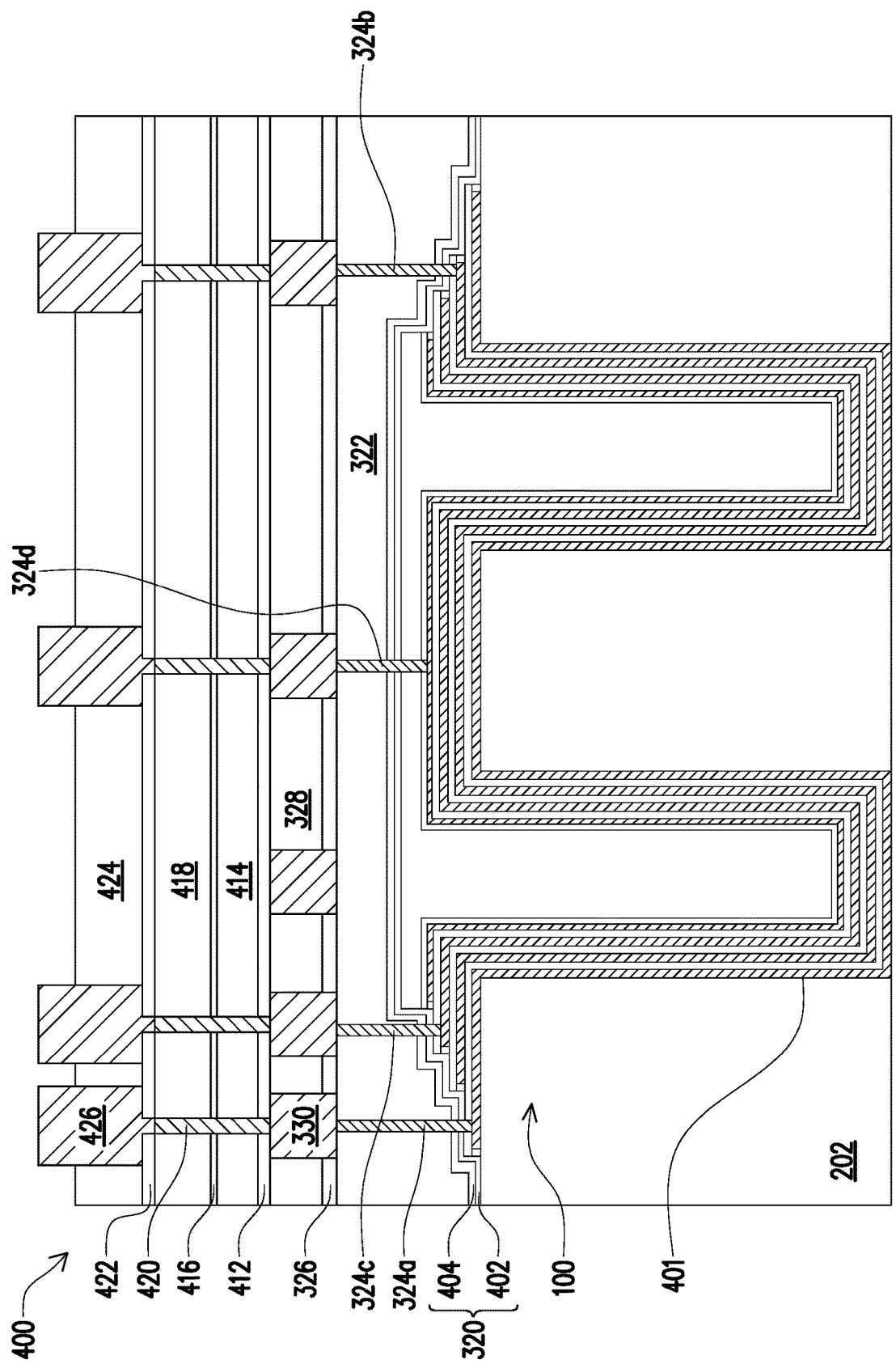
FIG. 4 illustrates a cross-sectional side view of an interconnect structure, in accordance with some embodiments.

FIG. 4 illustrates a cross-sectional side view of an interconnect structure 400 including the MIM capacitor 100, in accordance with some embodiments. As shown in FIG. 4, the etch stop layer 320 includes a first layer 402 and a second layer 404. In some embodiments, the first layer 402 is a nitride layer, such as a silicon nitride layer, and the second layer 404 is a carbide layer, such as a silicon carbide layer. A plurality of etch stop layers 412, 416, 422 and a plurality of dielectric layers 414, 418, 424 are formed over the dielectric layer 328 in an alternating manner. Conductive features 420 are formed in the dielectric layers 414, 418 and the etch stop layers 412, 416 and are in electrical contact with the conductive features 330. Conductive features 426 are formed in the dielectric layer 424 and the etch stop layer 422 and are in electrical contact with the conductive features 420. The conductive features 426, 420, 330, 324a-324d provide electrical current paths to the MIM capacitor 100.

Figure 5:
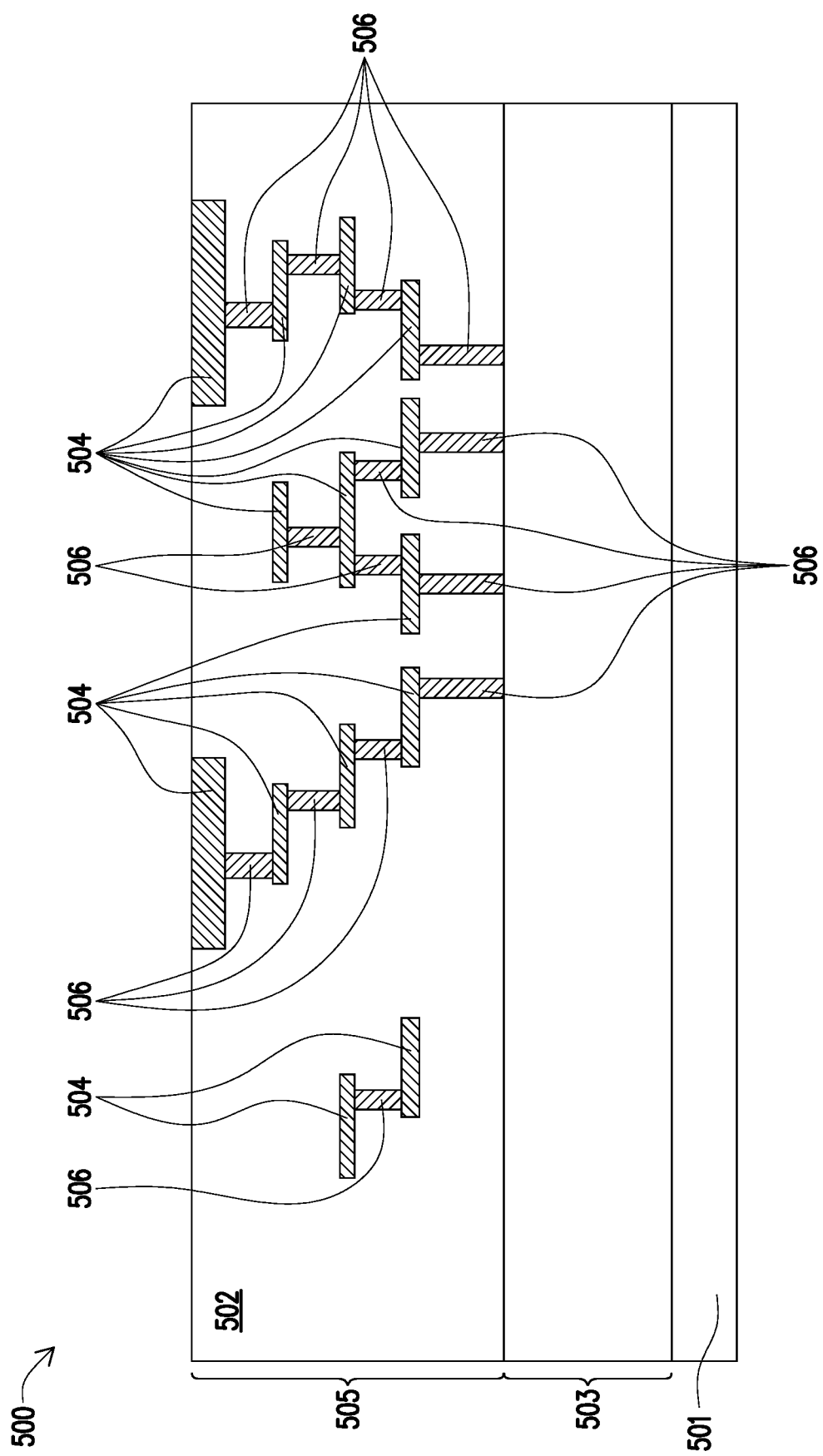
FIG. 5 illustrates a cross-sectional side view of a semiconductor device structure, in accordance with some embodiments.

FIG. 5 illustrates a cross-sectional side view of a semiconductor device structure 500, in accordance with some embodiments. As shown in FIG. 5, the semiconductor device structure 500 includes a substrate 501 and a device layer 503 disposed on the substrate 501. The substrate 501 may be any suitable substrate, such as a semiconductor substrate, for example a silicon wafer. The device layer 503 includes a plurality of devices. The plurality of devices may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The semiconductor device structure 500 further includes an interconnection structure 505 disposed over the device layer 503 and the substrate 501. The interconnection structure 505 includes various conductive features, such as a first plurality of conductive features 504 and second plurality of conductive features 506, and an IMD layer 502 to separate and isolate various conductive features 504, 506. Etch stop layers may be omitted for clarity. In some embodiments, the first plurality of conductive features 504 are conductive lines and the second plurality of conductive features 506 are conductive vias. The interconnection structure 505 includes multiple levels of the IMD layer 502, and each level of the IMD layer 502 includes the conductive features 504 or conductive features 506. The conductive features 504 and conductive features 506 may be made from one or more electrically conductive materials, such as metal, metal alloy, metal nitride, or silicide. For example, the conductive features 504 and the conductive features 506 are made of copper, aluminum, rhodium, ruthenium, iridium, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. In some embodiments, the conductive features 504, 506 may include barrier layers (not shown) and/or liners (not shown). For example, in some embodiments, each conductive feature 504 includes a conformal barrier layer and a conductive filling disposed on the conformal barrier layer.

The IMD layer 502 includes one or more dielectric materials to provide isolation functions to various conductive features 504, 506. The IMD layer 502 may include multiple dielectric layers embedding multiple levels of conductive features 504, 506. The IMD layer 502 is made from a dielectric material, such as $SiO_x$, $SiO_xC_yH_z$, or $SiO_xC_y$, where x, y and z are integers or non-integers. In some embodiments, the IMD layer 502 includes a dielectric material having a k value ranging from about 1 to about 5. In some embodiments, the IMD layer 502 includes the same material as the dielectric material 202.

In some embodiments, the MIM capacitor 100 is embedded in the interconnect structure 505. The MIM capacitor 100 may be the DTC MIM capacitor 100 shown in FIG. 2, FIG. 3P, or FIG. 4. The MIM capacitor 100 is provided in the interconnect structure 500 where individual devices in the device layer 503 over the substrate 501 are interconnected with conductive features 504, 506 in respective IMD layers 502. Such method allows a construction of the MIM capacitor 100 in a deep trench through a plurality of dielectric layers, such as a plurality of the IMD layers 502, in the interconnect structure 500. Because of a large surface area from the deep trench extending through the plurality of dielectric layers, the capacitance density of the MIM capacitor 100 is increased.

Figure 6B:
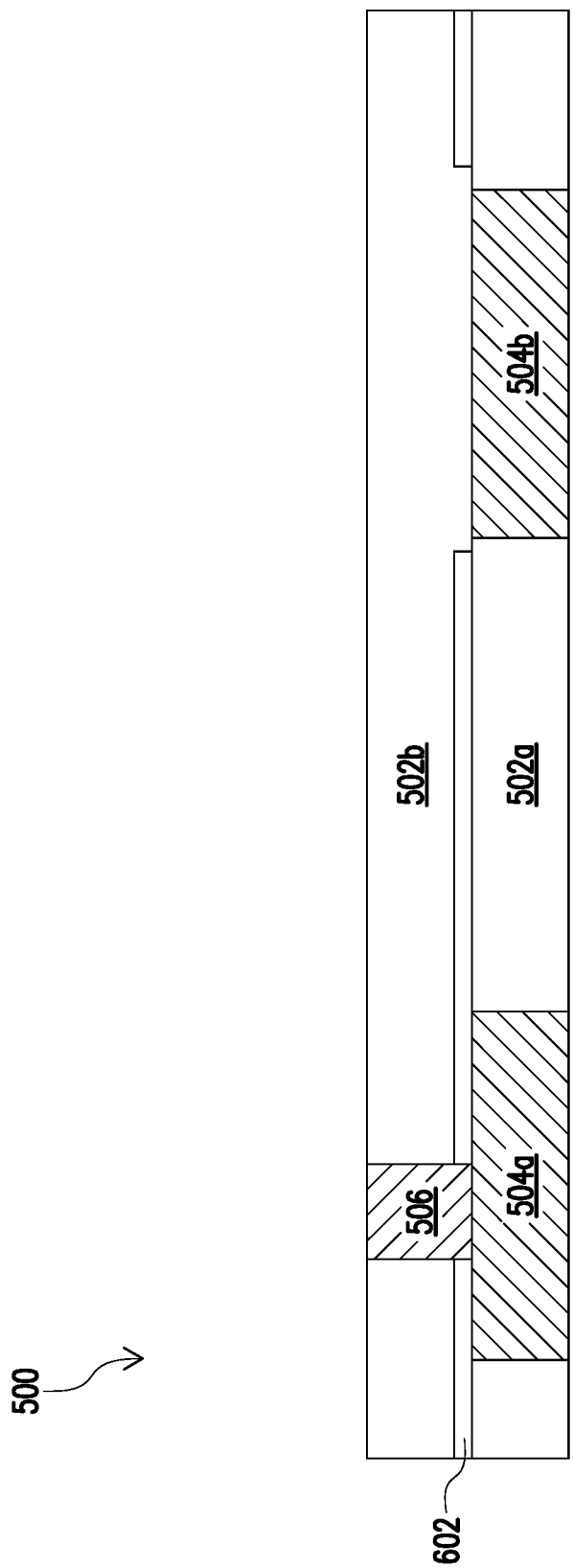

FIGS. 6A to 6I illustrate various stages of manufacturing the MIM capacitor 100 in the interconnect structure 500, in accordance with some embodiments. As shown in FIG. 6A, the interconnect structure 500 includes an IMD layer 502a and the conductive features 504a, 504b formed in the IMD layer 502a. An etch stop layer 602 is formed on the IMD layer 502a and the conductive features 504a, 504b. The IMD layer 502a may be one level of the IMD layer 502. In some embodiments, the IMD layer 502a may be located on an interlayer dielectric (ILD) layer, which means the IMD layer 502a is located at the bottom of the interconnect structure 500. In some embodiments, the IMD layer 502a is located at the middle of the interconnect structure 500. The conductive features 504a, 504b may be the conductive features 504, such as conductive lines. The conductive features 504a may be used to provide electrical path to one or more devices in the device layer 503, while the conductive feature 504b may be used to electrically connect the subsequently formed MIM capacitor 100 to one or more devices in the device layer 503. The etch stop layer 602 may include the same material as the etch stop layer 211 (FIG. 2) and may be formed by the same process as the etch stop layer 211.

As shown in FIG. 6B, the etch stop layer 602 is patterned to expose at least a portion of the conductive feature 504b, which may be electrically connected to the subsequently formed MIM capacitor 100. A patterned mask (not shown) may be formed on a portion of the etch stop layer 602, and the exposed portion of the etch stop layer 602 is removed by any suitable process. In some embodiments, a selective dry etch process is performed to remove the exposed portion of the etch stop layer 602. The selective dry etch process does not substantially affect the conductive feature 504b and the IMD layer 502a. In some embodiments, the entire top surface of the conductive feature 504b is exposed. Next, as shown in FIG. 6B, an IMD layer 502b is formed on the etch stop layer 602, the IMD layer 502a, and the conductive feature 504b. The IMD layer 502b may be a level of the IMD layer 502. The conductive feature 506 is formed in the IMD layer 502b and is electrically connected to the conductive feature 504a. The conductive feature 506 may be a conductive via. The conductive feature 506 may be formed by first forming an opening in the IMD layer 502b and the etch stop layer 602 and then filling the opening with the conductive feature 506. Thus, the conductive feature 506 is in contact with the etch stop layer 602.

Figure 6C:
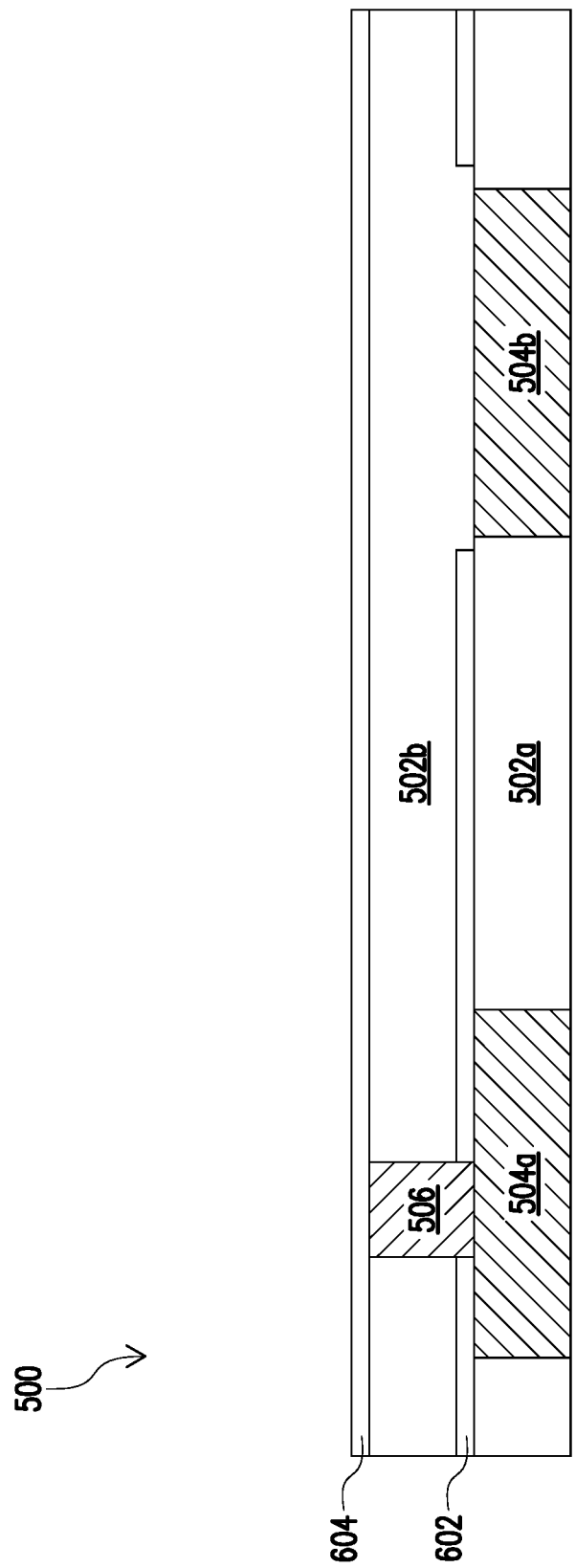
Figure 6D:
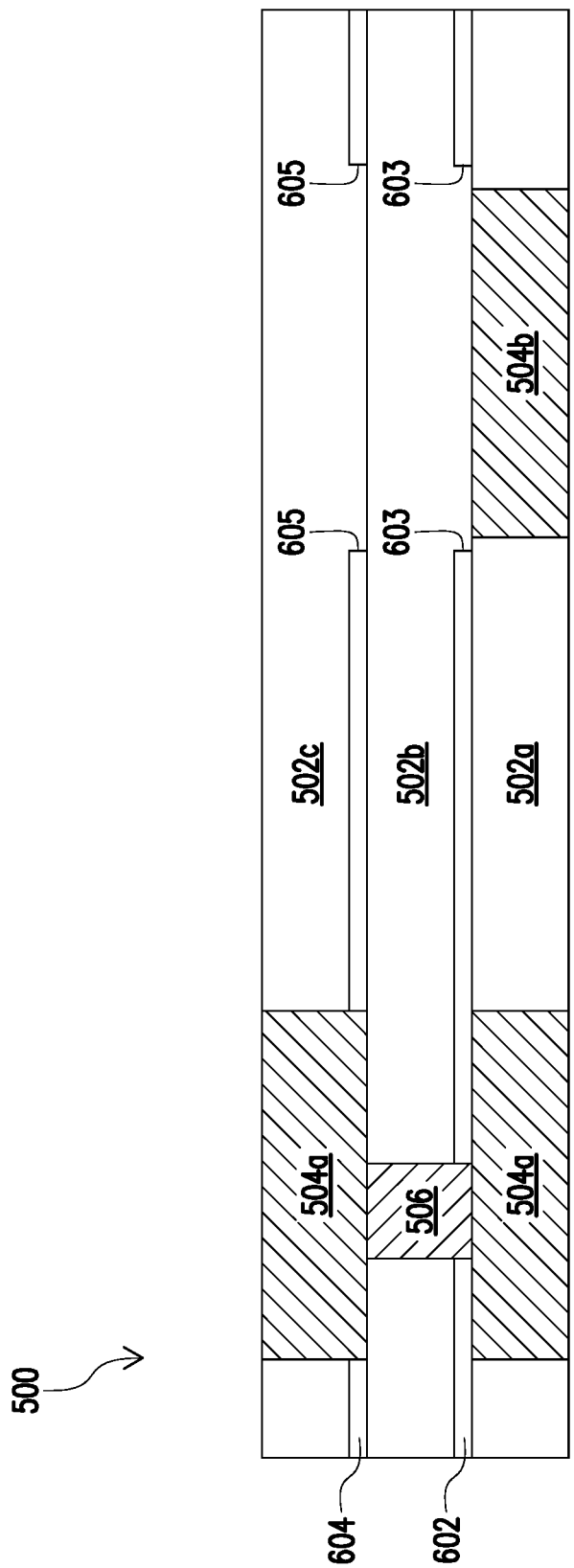

As shown in FIG. 6C, an etch stop layer 604 is formed on the IMD layer 502b and the conductive feature 506. The etch stop layer 604 may include the same material as the etch stop layer 602 and may be formed by the same process as the etch stop layer 602. Next, as shown in FIG. 6D, the etch stop layer 604 is patterned to expose at least a portion of the IMD layer 502b disposed on the conductive feature 504b. The patterning process of the etch stop layer 604 may be the same as the patterning process of the etch stop layer 602. In some embodiments, edges 605 of the etch stop layer 604 may be substantially aligned vertically with edges 603 of the etch stop layer 602, as shown in FIG. 6D. Next, as shown in FIG. 6D, an IMD layer 502c is formed on the etch stop layer 604 and the IMD layer 502b. The IMD layer 502c may be a level of the IMD layer 502. A conductive feature 504a is formed in the IMD layer 502c and is electrically connected to the conductive feature 506. The conductive feature 504a may be a conductive line. The conductive feature 504a may be formed by first forming an opening in the IMD layer 502c and the etch stop layer 604 and then filling the opening with the conductive feature 504a. Thus, the conductive feature 504a is in contact with the etch stop layer 604.

Figure 6E:
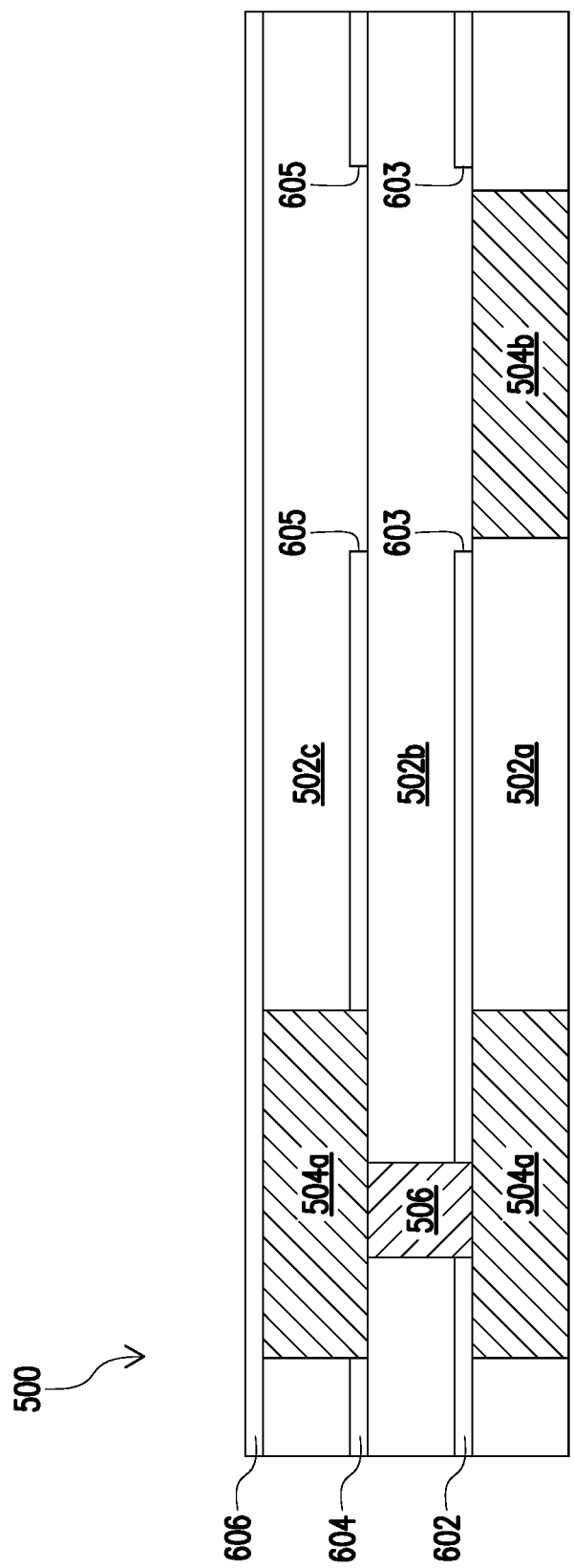
Figure 6F:
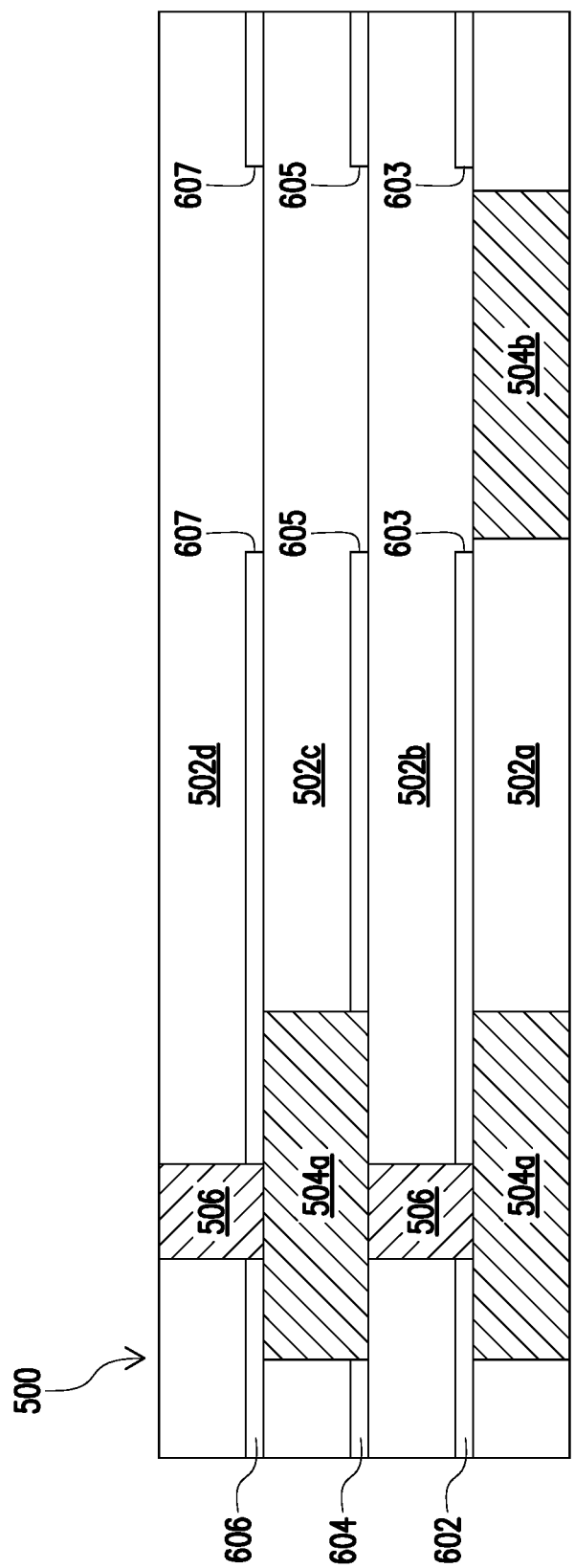

As shown in FIG. 6E, an etch stop layer 606 is formed on the IMD layer 502c and the conductive feature 504a. The etch stop layer 606 may include the same material as the etch stop layer 602 and may be formed by the same process as the etch stop layer 602. Next, as shown in FIG. 6F, the etch stop layer 606 is patterned to expose at least a portion of the IMD layer 502c. The patterning process of the etch stop layer 606 may be the same as the patterning process of the etch stop layer 602. In some embodiments, edges 607 of the etch stop layer 606 may be substantially aligned vertically with the edges 603, 605 of the etch stop layers 602, 604, respectively, as shown in FIG. 6F. Next, as shown in FIG. 6F, an IMD layer 502d is formed on the etch stop layer 606 and the IMD layer 502c. The IMD layer 502d may be a level of the IMD layer 502. A conductive feature 506 is formed in the IMD layer 502d and is electrically connected to the conductive feature 504a. The conductive feature 506 may be a conductive via. The conductive feature 506 may be formed by first forming an opening in the IMD layer 502d and the etch stop layer 606 and then filling the opening with the conductive feature 506. Thus, the conductive feature 506 is in contact with the etch stop layer 606.

Figure 6G:
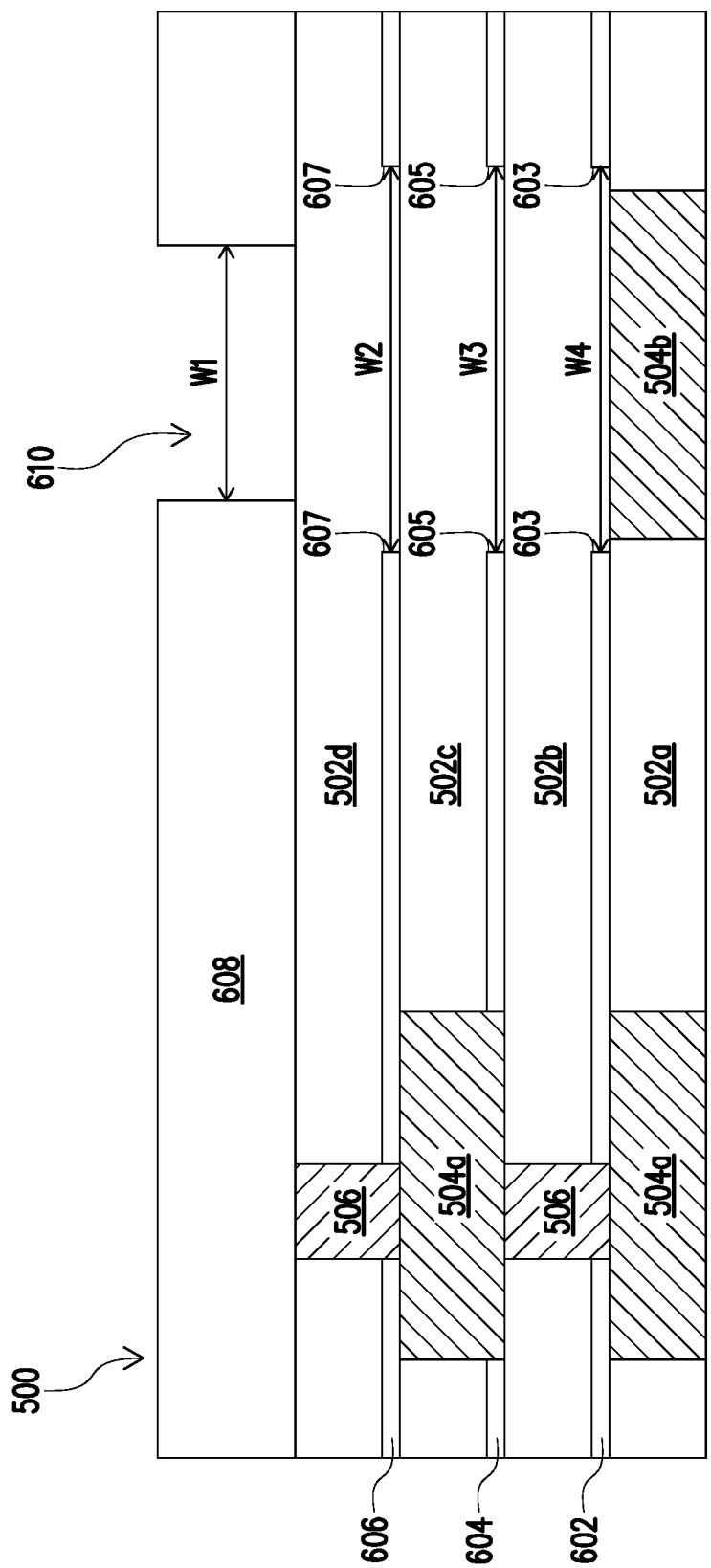

As shown in FIG. 6G, a patterned mask 608 is formed on the IMD layer 502d and the conductive feature 506. A portion of the IMD layer 502d is exposed by the patterned mask 608. The exposed portion of the IMD layer 502d may be located above the conductive feature 504b. In some embodiments, the patterned mask 608 includes an opening 610 having a width W1, which may be substantially less than a width W2 of the portion of the IMD layer 502d located between the edges 607, a width W3 of the portion of the IMD layer 502c located between the edges 605, or a width W4 of the portion of the IMD layer 502b located between the edges 603. In some embodiments, the edges 603, 605, 607 are substantially aligned, and the width W2, W3, W4 are substantially the same. In some embodiments, the edges 603, 605, 607 may be substantially offset, and the width W2, W3, W4 are substantially the same. In some embodiments, the edges 603, 605, 607 may be substantially offset, and the width W2, W3, W4 are substantially different. In the above-mentioned embodiments, the width W1 of the opening 610 is substantially less than the width W2, W3, W4, and the edges of the patterned mask 608 are within the edges 603, 605, 607 along the horizontal axis.

Figure 6H:
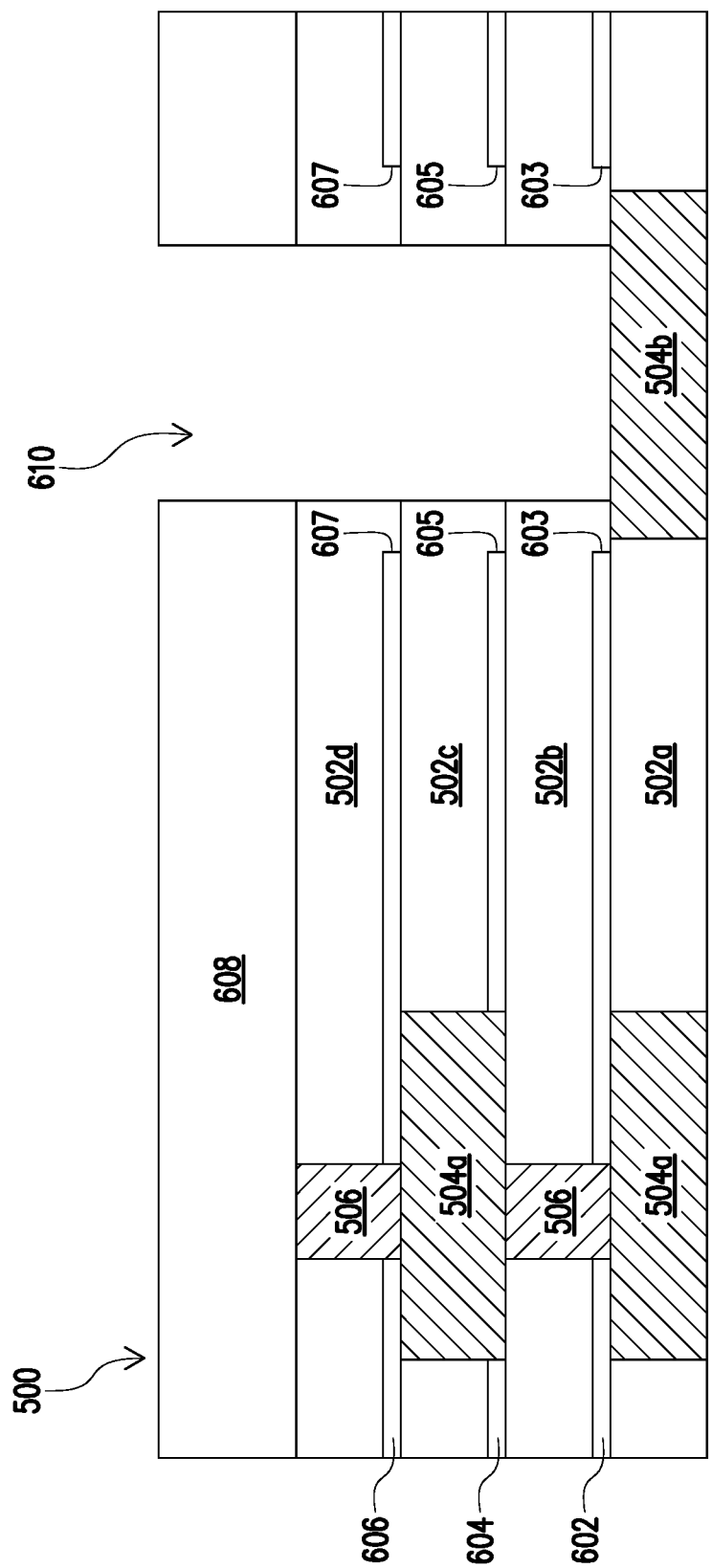
Figure 61:
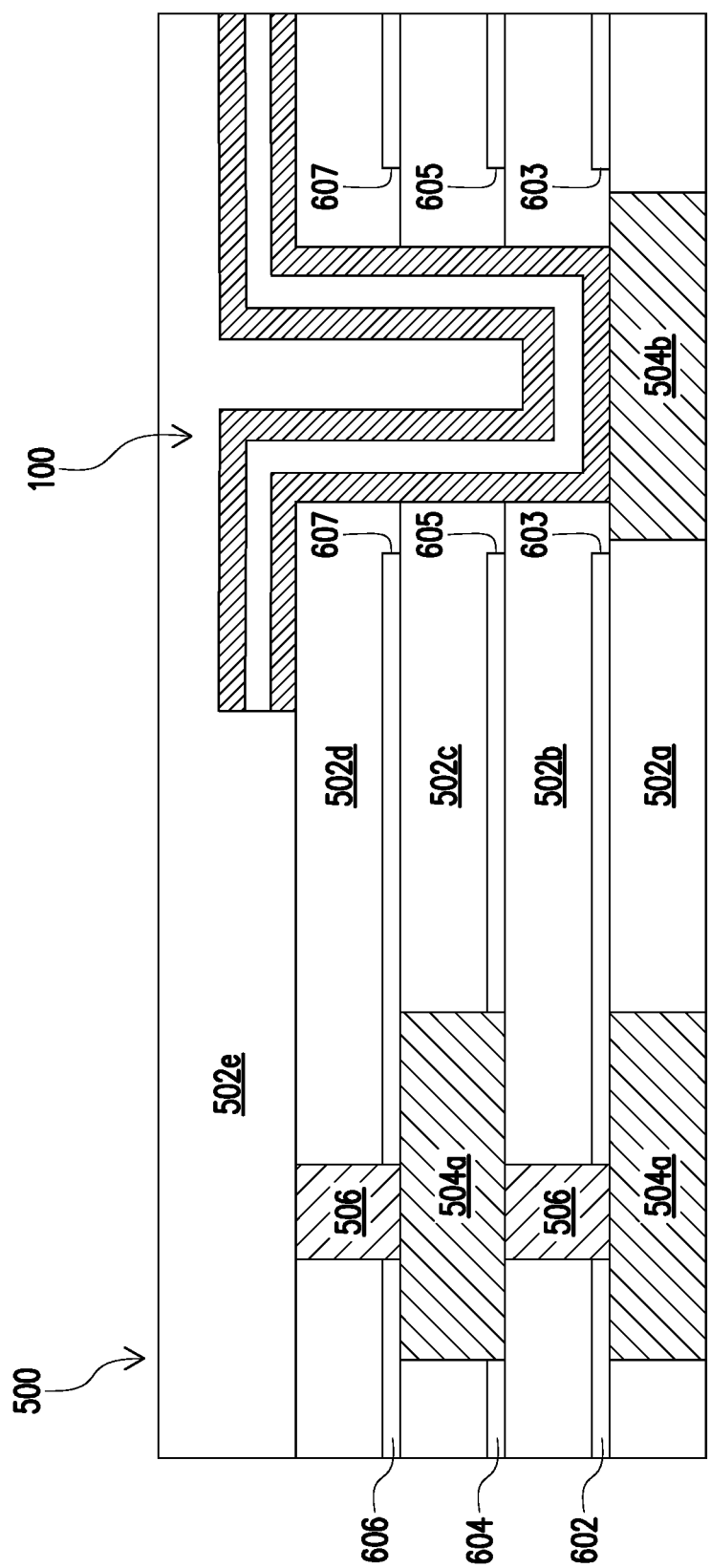

As shown in FIG. 6H, the opening 610 is extended in the IMD layers 502d, 502c, 502b to expose at least a portion of the conductive feature 504b. In some embodiments, three IMD layers 502d, 502c, 502b are formed over the conductive feature 504b, and the openings 610 are formed in three IMD layers 502d, 502c, 502b. In some embodiments, additional IMD layers are formed over the conductive feature 504b by the same processes described in FIGS. 6A to 6F, and the opening 610 extends through multiple IMD layers so the opening 610 has a depth of about 15 microns to about 17 microns (not counting the depth in the patterned mask 608). In some embodiments, the opening 610 has the same depth as the opening 302 (FIG. 3E). In some embodiments, multiple openings 610 are formed in the multiple IMD layers, such as the multiple openings 302 (FIG. 3E). The process to extend the opening 610 in the multiple IMD layers may be the same as the process to form the opening 302 having the depth D2 (FIG. 3D). Furthermore, because the portions of the etch stop layers 602, 604, 606 are removed prior to extending the opening 610 in the IMD layers 502b, 502c, 502d, a single etch process (or two etch processes if the sidewall passivation layer described in FIGS. 3B to 3D are utilized) may be performed to extend the opening 610. In other words, if the portions of the etch stop layers 602, 604, 606 are not removed prior to extending the opening 610, the opening 610 formed in the multiple IMD layers may not have substantially constant critical dimension from the top to the bottom and/or over etching of the multiple IMD layers may occur. As shown in FIG. 6H, the edges 603, 605, 607 are a distance away from the opening 610 in order to provide process tolerance in forming the opening 610.

As shown in FIG. 6I, the patterned mask 608 is removed, and the MIM capacitor 100 is formed in the opening 610. The MIM capacitor 100 may be the MIM capacitor 100 shown in FIG. 2, FIG. 3N, or FIG. 4. The edges 603, 605, 607 of the etch stop layers 602, 604, 606, respectively, are spaced apart along the horizontal axis from the MIM capacitor 100. In some embodiments, the IMD layer 502b is disposed between and in contact with the edges 603 and the MIM capacitor 100, the IMD layer 502c is disposed between and in contact with the edges 605 and the MIM capacitor 100, and the IMD layer 502d is disposed between and in contact with the edges 607 and the MIM capacitor 100. An IMD layer 502e is formed on the conductive feature 506, the IMD layer 502d, the MIM capacitor 100, and the IMD layer 502e fills the opening 610. The IMD layer 502e may be a level of the IMD 502. An etch stop layer (not shown) may be formed between the MIM capacitor 100 and the IMD layer 502e.

The present disclosure provides a MIM capacitor 100 formed in a deep trench in an interconnect structure. The MIM capacitor 100 includes a capacitor insulator structure 104 having an amorphous layer sandwiched between two crystalline layers. The deep trench may be greater than about 10 microns, such as from about 15 microns to about 17 microns. Some embodiments may achieve advantages. For example, the MIM capacitor 100 has capacitance density of greater than about 3000 $\mu F/\mu m^2$, and the lifetime of the MIM capacitor 100 is improved. For example, the TDDB may be about 299 years.

An embodiment is a method. The method includes forming an opening having a first depth in one or more dielectric layers, depositing a layer in the opening and on the one or more dielectric layers, performing an anisotropic etch process to remove portions of the layer formed on horizontal surfaces, extending the opening to a second depth in the one or more dielectric layers, removing the layer, extending the opening to a third depth in the one or more dielectric layers, and forming a metal-insulator-metal (MIM) capacitor in the opening. The forming the MIM capacitor includes depositing a first conductive layer in the opening, forming a first capacitor insulator structure on the first conductive layer, and depositing a second conductive layer on the first capacitor insulator structure. The forming the first capacitor insulator structure includes depositing a first crystalline layer, depositing an amorphous layer on the first crystalline layer, and depositing a second crystalline layer on the amorphous layer.

Another embodiment is a method. The method includes depositing a first etch stop layer on a first dielectric layer and first and second conductive features formed in the first dielectric layer, removing a portion of the first etch stop layer to expose at least an exposed portion of the second conductive feature, depositing a second dielectric layer on the first etch stop layer and the exposed portion of the second conductive feature, depositing a second etch stop layer on the second dielectric layer, removing a portion of the second etch stop layer to expose a portion of the second dielectric layer disposed on the second conductive feature, depositing a third dielectric layer on the second etch stop layer and the exposed portion of the second dielectric layer, forming an opening in the second and third dielectric layers to expose at least a portion of the second conductive feature, and forming a metal-insulator-metal (MIM) capacitor in the opening.

A further embodiment is an interconnect structure. The structure includes a first dielectric layer disposed over a substrate, a first conductive feature disposed in the first dielectric layer, a second conductive feature disposed in the first dielectric layer, a first etch stop layer disposed on a portion of the first conductive feature and a portion of the first dielectric layer, a second dielectric layer disposed on the first etch stop layer and a portion of the second conductive feature, and a third conductive feature disposed in and in contact with the second dielectric layer and the first etch stop layer. The third conductive feature is electrically connected to the first conductive feature. The interconnect structure further includes a second etch stop layer disposed on a portion of the second dielectric layer, a third dielectric layer disposed on the second etch stop layer, and a fourth conductive feature disposed in and in contact with the third dielectric layer and the second etch stop layer. The fourth conductive feature is electrically connected to the third conductive feature. The interconnect structure further includes a metal-insulator-metal (MIM) capacitor disposed in the second and third dielectric layers, the second dielectric layer is disposed between and in contact with the first etch stop layer and the MIM capacitor, and the third dielectric layer is disposed between and in contact with the second etch stop layer and the MIM capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming an opening in one or more dielectric layers, wherein the opening has a first depth;
    depositing a layer in the opening and on the one or more dielectric layers;
    performing an anisotropic etch process to remove portions of the layer formed on horizontal surfaces;
    extending the opening to a second depth in the one or more dielectric layers;
    removing the layer;
    extending the opening to a third depth in the one or more dielectric layers; and
    forming a metal-insulator-metal (MIM) capacitor in the opening, comprising:
        depositing a first conductive layer in the opening;
        forming a first capacitor insulator structure on the first conductive layer, comprising:
            depositing a first crystalline layer;
            depositing an amorphous layer on the first crystalline layer; and
            depositing a second crystalline layer on the amorphous layer; and
        depositing a second conductive layer on the first capacitor insulator structure.

2. The method of claim 1, wherein the layer comprises a polymer.

3. The method of claim 1, wherein the extending the opening to the third depth removes a step formed on a sidewall of the one or more dielectric layers.

4. The method of claim 1, wherein forming the MIM capacitor further comprises forming a second capacitor insulator structure on the second conductive layer and depositing a third conductive layer on the second capacitor insulator structure.

5. The method of claim 1, wherein the amorphous layer is a tantalum oxide layer or a tantalum-based oxide layer.

6. The method of claim 5, wherein each of the first and second crystalline layers is a hafnium oxide layer.

7. The method of claim 6, wherein the first conductive layer, the amorphous layer, the first and second crystalline layers, and the second conductive layer are formed by atomic layer deposition processes.

8. A method, comprising:
    depositing a first etch stop layer on a first dielectric layer and first and second conductive features formed in the first dielectric layer;
    removing a portion of the first etch stop layer to expose at least an exposed portion of the second conductive feature;
    depositing a second dielectric layer on the first etch stop layer and the exposed portion of the second conductive feature;
    depositing a second etch stop layer on the second dielectric layer;
    removing a portion of the second etch stop layer to expose a portion of the second dielectric layer disposed on the second conductive feature;
    depositing a third dielectric layer on the second etch stop layer and the exposed portion of the second dielectric layer;
    forming an opening in the second and third dielectric layers to expose at least a portion of the second conductive feature; and
    forming a metal-insulator-metal (MIM) capacitor in the opening.

9. The method of claim 8, wherein first edges are formed in the first etch stop layer after the removing the portion of the first etch stop layer, second edges are formed in the second etch stop layer after the removing the portion of the second etch stop layer, and the first edges are substantially aligned with the second edges.

10. The method of claim 9, wherein a portion of the second dielectric layer is formed between the first edges of the first etch stop layer, wherein the portion of the second dielectric layer has a first width.

11. The method of claim 10, wherein a portion of the third dielectric layer is formed between the second edges of the second etch stop layer, wherein the portion of the third dielectric layer has a second width.

12. The method of claim 11, wherein the first width is substantially the same as the second width.

13. The method of claim 12, wherein the opening has a third width substantially less than the first width or the second width.

14. The method of claim 11, wherein the first width is substantially different from the second width.

15. The method of claim 14, further comprising forming a third conductive feature in the second dielectric layer and the first etch stop layer, wherein the third conductive feature is electrically connected to the first conductive feature.

16. A method, comprising:
forming an opening in a dielectric layer;
forming a metal-insulator-metal (MIM) capacitor in the opening, comprising:
depositing a first conductive layer in the opening;
forming a capacitor insulator structure on the first conductive layer, comprising:
depositing a first crystalline layer, wherein the first crystalline layer comprises a first metal oxide;
depositing an amorphous layer on the first crystalline layer, wherein the amorphous layer comprises a second metal oxide different from the first metal oxide; and
depositing a second crystalline layer on the amorphous layer, wherein the second crystalline layer comprises a third metal oxide different from the second metal oxide; and
depositing a second conductive layer on the capacitor insulator structure, wherein a processing temperature during the forming of the MIM capacitor is lower than a crystalline temperature of the amorphous layer, and the first and second crystalline layers have crystallization temperatures greater than the processing temperature.

17. The method of claim 16, wherein the first and second crystalline layers have thicknesses ranging from 25 angstroms to 35 angstroms.

18. The method of claim 17, where a thickness of the amorphous layer is less than the thicknesses of the first and second crystalline layers.

19. The method of claim 16, wherein the first and third metal oxides each comprises hafnium oxide.

20. The method of claim 16, wherein the second metal oxide comprises tantalum oxide.

* * * * *